US012588308B2

(12) United States Patent
He

(10) Patent No.: US 12,588,308 B2
(45) Date of Patent: Mar. 24, 2026

(54) IMAGING DEVICE AND ELECTRONIC APPARATUS INCLUDING AT LEAST ONE LIGHT-BLOCKING SECTION

(71) Applicant: SONY SEMICONDUCTOR SOLUTIONS CORPORATION, Kanagawa (JP)

(72) Inventor: Yilun He, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 354 days.

(21) Appl. No.: 18/546,255

(22) PCT Filed: Jan. 25, 2022

(86) PCT No.: PCT/JP2022/002533
§ 371 (c)(1),
(2) Date: Aug. 11, 2023

(87) PCT Pub. No.: WO2022/181155
PCT Pub. Date: Sep. 1, 2022

(65) Prior Publication Data
US 2024/0136378 A1 Apr. 25, 2024
US 2024/0234459 A9 Jul. 11, 2024

(30) Foreign Application Priority Data

Feb. 26, 2021 (JP) ................................. 2021-031152

(51) Int. Cl.
*H10F 39/00* (2025.01)
*H04N 25/62* (2023.01)
*H10F 39/18* (2025.01)

(52) U.S. Cl.
CPC ......... *H10F 39/8057* (2025.01); *H04N 25/62* (2023.01); *H10F 39/182* (2025.01); *H10F 39/8063* (2025.01)

(58) Field of Classification Search
None
See application file for complete search history.

(56) References Cited

U.S. PATENT DOCUMENTS

2015/0035028 A1* 2/2015 Fan ...................... H04N 25/616
257/292
2015/0304582 A1* 10/2015 Hirota ................ G02B 27/0075
348/49
(Continued)

FOREIGN PATENT DOCUMENTS

JP 2013-098446 5/2013
JP 2016-103541 6/2016
(Continued)

OTHER PUBLICATIONS

International Search Report and Written Opinion prepared by the Japan Patent Office on Mar. 30, 2022, for International Application No. PCT/JP2022/002533, 2 pgs.

*Primary Examiner* — Nilufa Rahim
(74) *Attorney, Agent, or Firm* — SHERIDAN ROSS P.C.

(57) ABSTRACT

An imaging device includes: a semiconductor substrate in which multiple sensor pixels are arranged in array, the semiconductor substrate having a first surface serving as a light incident surface and a second surface opposed thereto; a photoelectric conversion section provided on a side of the first surface inside the semiconductor substrate and generating electric charge corresponding to a light reception amount by photoelectric conversion; a charge-holding section provided on a side of the second surface inside the semiconductor substrate and holding the electric charge transferred from the photoelectric conversion section; a first light-blocking section extending in an in-plane direction of the semiconductor substrate between the photoelectric conversion section and the charge-holding section; and a light-condensing optical system provided on the side of the first (Continued)

surface and condensing incident light on a substantial geometric center of the first light-blocking section in a plan view.

20 Claims, 23 Drawing Sheets

(56)                    References Cited

U.S. PATENT DOCUMENTS

| | | | |
|---|---|---|---|
| 2016/0155774 A1 | 6/2016 | Hasegawa et al. | |
| 2016/0240571 A1* | 8/2016 | Baek .................. | H10F 39/8053 |
| 2018/0033809 A1 | 2/2018 | Tayanaka et al. | |
| 2020/0235146 A1 | 7/2020 | Yoshita et al. | |
| 2021/0335862 A1* | 10/2021 | Lee ...................... | H10F 39/807 |

FOREIGN PATENT DOCUMENTS

| | | |
|---|---|---|
| JP | 2016-534557 | 11/2016 |
| WO | WO 2016/136486 | 9/2016 |
| WO | WO 2018/163732 | 9/2018 |
| WO | WO 2019/240207 | 12/2019 |

* cited by examiner

Figure 16:
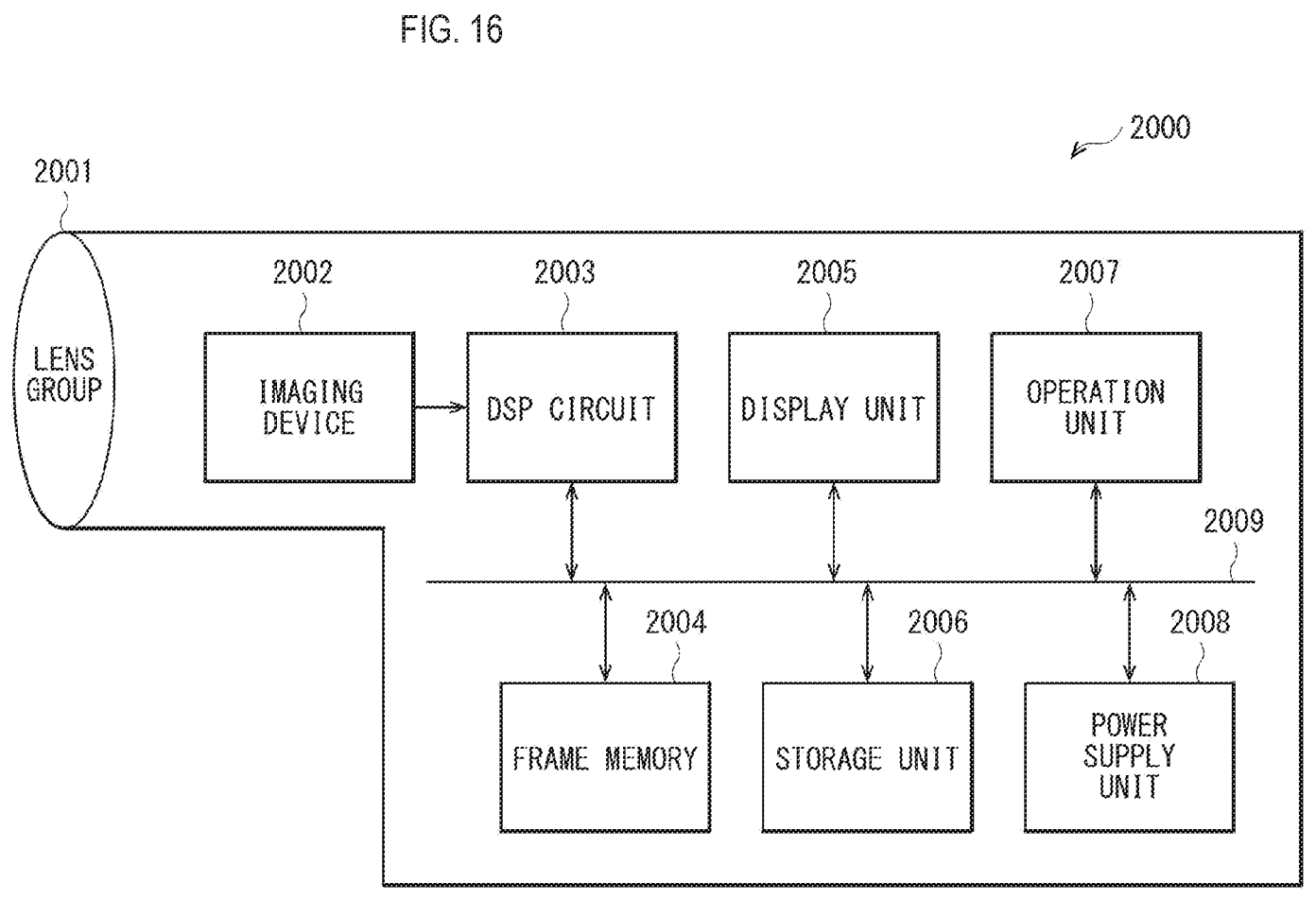

2001 — LENS GROUP

2002 — IMAGING DEVICE

2003 — DSP CIRCUIT

2005 — DISPLAY UNIT

2007 — OPERATION UNIT

2009

2004 — FRAME MEMORY

2006 — STORAGE UNIT

2008 — POWER SUPPLY UNIT

IMAGING DEVICE AND ELECTRONIC APPARATUS INCLUDING AT LEAST ONE LIGHT-BLOCKING SECTION

CROSS REFERENCE TO RELATED APPLICATIONS

This application is a national stage application under 35 U.S.C. 371 and claims the benefit of PCT Application No. PCT/JP2022/002533, having an international filing date of 25 Jan. 2022, which designated the United States, which PCT application claimed the benefit of Japanese Patent Application No. 2021-031152, filed 26 Feb. 2021, the entire disclosures of each of which are incorporated herein by reference.

TECHNICAL FIELD

The present disclosure relates to an imaging device that performs imaging by performing photoelectric conversion, and an electronic apparatus including the imaging device.

BACKGROUND ART

For example, PTL 1 discloses an imaging device that includes a photoelectric conversion section and a charge-holding section in an Si (111) substrate extending along a horizontal plane orthogonal to a thickness direction (a first direction) and includes a light-blocking section including a horizontal light-blocking portion positioned therebetween and extending along a horizontal plane and a vertical light-blocking portion orthogonal to the horizontal light-blocking portion to thereby improve a light-blocking property for the charge-holding section.

CITATION LIST

Patent Literature

PTL 1: International Publication No. WO2019/240207

SUMMARY OF THE INVENTION

An imaging device is thus required to improve deteriorated characteristics of parasitic light sensitivity due to leakage in light blocking.

It is desirable to provide an imaging device and an electronic apparatus that make it possible to improve parasitic light sensitivity.

An imaging device according to an embodiment of the present disclosure includes: a semiconductor substrate in which multiple sensor pixels are arranged in array, the semiconductor substrate having a first surface that serves as a light incident surface and a second surface opposed to the first surface; a photoelectric conversion section provided on a side of the first surface inside the semiconductor substrate and generating electric charge corresponding to an amount of light reception by photoelectric conversion; a charge-holding section provided on a side of the second surface inside the semiconductor substrate and holding the electric charge transferred from the photoelectric conversion section; a first light-blocking section extending in an in-plane direction of the semiconductor substrate between photoelectric conversion section and the charge-holding section; and a light-condensing optical system provided on the side of the first surface and condensing incident light on a substantial geometric center of the first light-blocking section in a plan view.

An electronic apparatus according to an embodiment of the present disclosure includes the imaging device according to according to an embodiment of the present disclosure.

In the imaging device according to an embodiment of the present disclosure and the electronic apparatus according to an embodiment of the present disclosure, the first light-blocking section extending in the in-plane direction of the semiconductor substrate is provided between the photoelectric conversion section and the charge-holding section that are provided, respectively, on the side of the first surface and the side of the second surface, which are opposed to each other in the semiconductor substrate, and further the light-condensing optical system that condenses incident light on the substantial geometric center of the first light-blocking section in a plan view is provided on the side of the first surface. Consequently, light having passed through without being absorbed by the photoelectric conversion section is prevented from entering the charge-holding section.

BRIEF DESCRIPTION OF THE DRAWINGS

FIG. 4 is a schematic cross-sectional view of the pixel array section taken along a line I-I illustrated in FIG. 3.

FIG. 6 is a planar schematic view of an example of a configuration of a pixel array section in an imaging device according to a second embodiment of the present disclosure.

FIG. 7 is a schematic cross-sectional view of the pixel array section taken along a line II-II illustrated in FIG. 6.

FIG. 13 is a schematic cross-sectional view of an example of a configuration of a pixel array section in an imaging device according to Modification Example 4 of the present disclosure.

FIG. 16 is a schematic view of an example of an overall configuration of an electronic apparatus.

MODES FOR CARRYING OUT THE INVENTION

Figure 1:
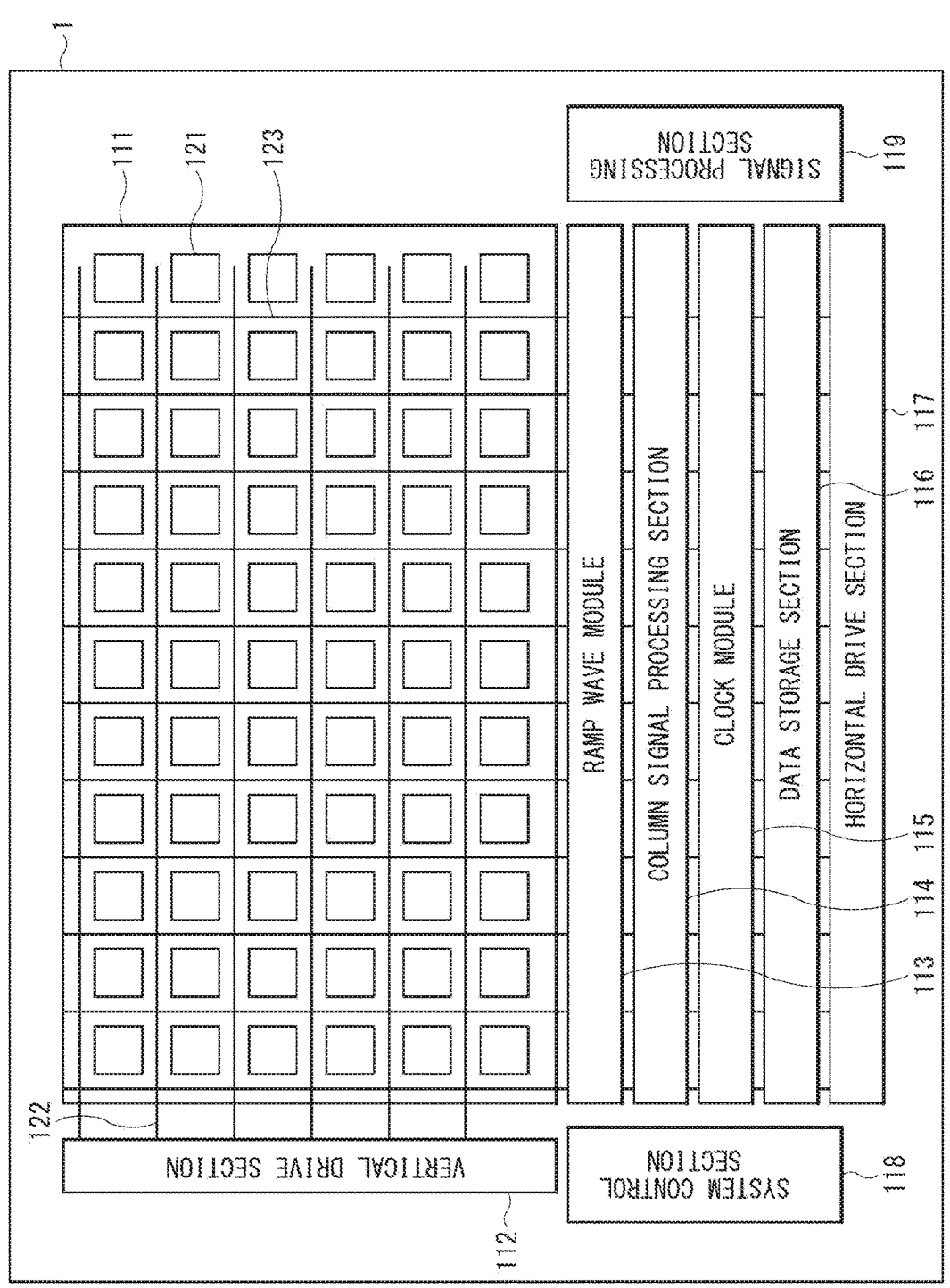
FIG. 1 is a block diagram illustrating a configuration example of functions of an imaging device according to a first embodiment of the present disclosure.

In the following, description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. First Embodiment
(An example of an imaging device in which a horizontal light-blocking section and a light-receiving lens are arranged to allow incident light to be condensed on a substantial geometric center of the horizontal light-blocking section)
2. Second Embodiment
(An example of an imaging device including a horizontal light-blocking section extending in one direction)
3. Modification examples
   3-1. Modification Example 1 (An example of a planar shape of a light-blocking section)
   3-2. Modification Example 2 (An example of a planar layout of a light-blocking section and a light-receiving lens with respect to a sensor pixel)
   3-3. Modification Example 3 (An example of a planar layout of a color filter)
   3-4. Modification Example 4 (Another example of a configuration of a light-blocking section)
   3-5. Modification Example 5 (Another example of a configuration of a light-blocking section)
   3-6. Modification Example 6 (Another example in which multiple light-receiving lenses are provided)
4. Example of Application to Electronic Apparatus
5. Example of Practical Application to Mobile Body
6. Other Modification Examples

1. First Embodiment

[Configuration of Imaging Device 1]
FIG. 1 illustrates a configuration example of functions of an imaging device (an imaging device 1) according to a first embodiment of the present disclosure.

The imaging device 1 is, for example, a back-illuminated image sensor of a so-called global shutter system, such as a CMOS (Complementary Metal Oxide Semiconductor)

image sensor. The imaging device 1 receives light from a subject and performs photoelectric conversion to generate an image signal, thereby capturing an image.

The global shutter system is a system in which global exposure is performed, which basically starts exposure simultaneously for all pixels and finishes the exposure simultaneously for all the pixels. As used herein, all the pixels refer to all of pixels of a portion appearing in an image, and exclude a dummy pixel, or the like. In addition, the global shutter system also includes a system in which a region where global exposure is performed is moved while performing global exposure in a unit of multiple rows (e.g., several tens of rows) instead of all pixels simultaneously when a time difference or an image distortion is small enough to be unproblematic. In addition, the global shutter system also includes a system in which global exposure is performed on pixels of a predetermined region, instead of all of the pixels of the portion appearing in the image.

The back-illuminated image sensor refers to an image sensor having a configuration in which a photoelectric conversion section such as a photodiode that receives light from a subject and converts the light into an electric signal is provided between a light-receiving surface on which the light from the subject is incident and a wiring layer provided with a wiring line of a transistor, or the like that drives each pixel. It is to be noted that the present technology is not limited to the application to the CMOS image sensor.

The imaging device 1 includes, for example, a pixel array section 111, a vertical drive section 112, a ramp wave module 113, a column signal processing section 114, a clock module 115, a data storage section 116, a horizontal drive section 117, a system control section 118, and a signal processing section 119.

In the imaging device 1, the pixel array section 111 is formed on a semiconductor substrate 11 (described later). A peripheral circuit, such as the vertical drive section 112 to the signal processing section 119, is formed, for example, on the same semiconductor substrate 11 as the pixel array section 111.

The pixel array section 111 includes multiple sensor pixels 121 each including a photoelectric conversion element that generates and accumulates electric charge corresponding to an amount of light incident from the subject. As illustrated in FIG. 1, the sensor pixels 121 are arranged in each of a lateral direction (row direction) and a longitudinal direction (column direction). In the pixel array section 111, pixel drive lines 122 are wired along the row direction for each pixel row including the sensor pixels 121 arranged in line in the row direction, whereas vertical signal lines 123 are wired along the column direction for each pixel column including the sensor pixels 121 arranged in line in the column direction.

The vertical drive section 112 includes a shift register, an address decoder, and the like. The vertical drive section 112 supplies respective signals or the like to the multiple sensor pixels 121 via the multiple pixel drive lines 122, to thereby drive all of the multiple sensor pixels 121 in the pixel array section 111 simultaneously or in a unit of pixel rows.

The ramp wave module 113 generates a ramp wave signal to be used for A/D (Analog/Digital) conversion of a pixel signal, and supplies the generated ramp wave signal to the column signal processing section 114. The column signal processing section 114 includes, for example, a shift register, an address decoder, and the like, and performs noise cancellation processing, correlation double sampling processing, A/D conversion processing, or the like to generate a pixel signal. The column signal processing section 114 supplies the generated pixel signal to the signal processing section 119.

The clock module 115 supplies a clock signal for operation to each section of the imaging device 1.

The horizontal drive section 117 sequentially selects a unit circuit corresponding to a pixel column of the column signal processing section 114. As a result of selective scanning by the horizontal drive section 117, a pixel signal having undergone signal processing for each unit circuit in the column signal processing section 114 is sequentially outputted to the signal processing section 119.

The system control section 118 includes a timing generator or the like that generates various timing signals. On the basis of timing signals generated by the timing generator, the system control section 118 performs drive control of the vertical drive section 112, the ramp wave module 113, the column signal processing section 114, the clock module 115, and the horizontal drive section 117.

The signal processing section 119 performs signal processing such as arithmetic processing on the pixel signal supplied from the column signal processing section 114 while temporarily storing data in the data storage section 116 as necessary, and outputs an image signal including each pixel signal.

[Configuration of Sensor Pixel 121]

Figure 2:
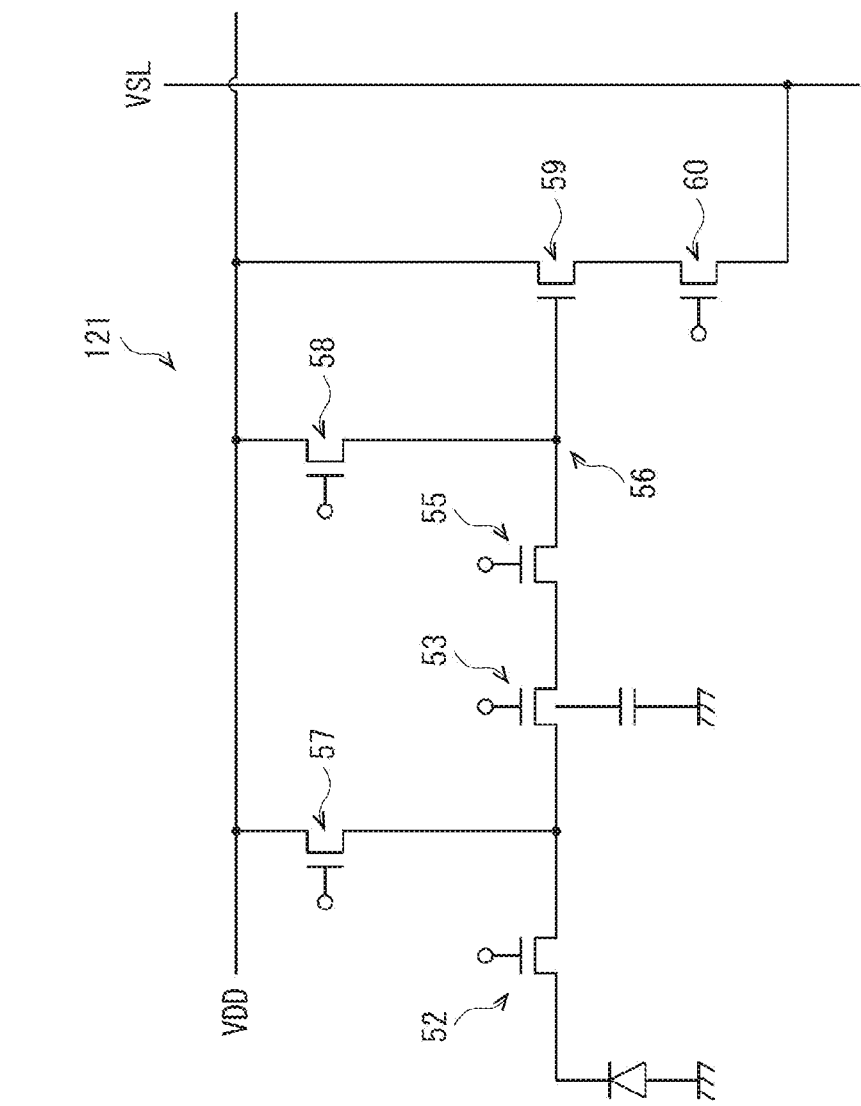
FIG. 2 is a circuit diagram illustrating an example of a circuit configuration of a portion of a sensor pixel in the imaging device illustrated in FIG. 1.

Next, description is given, with reference to FIG. 2, of a circuit configuration example of the sensor pixel 121 formed in the pixel array section 111 in FIG. 1. FIG. 2 illustrates an example of a circuit configuration of one sensor pixel 121 of the pixel array section 111.

In the example of FIG. 2, the sensor pixel 121 in the pixel array section 111 includes a photoelectric conversion section 51, a first transfer transistor (TRX) 52, a second transfer transistor (TRM) 53, a charge-holding section (MEM) 54, a third transfer transistor (TRG) 55, a charge-voltage converting section (FD) 56, a discharge transistor (OFG) 57, a reset transistor (RST) 58, an amplification transistor (AMP) 59, and a selection transistor (SEL) 60.

In addition, in this example, the TRX 52, the TRM 53, the TRG 55, the OFG 57, the RST 58, the AMP 59 and the SEL 60 are each an N-type MOS transistor. Drive signals S52, S53, S55, S57, S58, and S60 are supplied to respective gate electrodes of the TRX 52, the TRM 53, the TRG 55, the OFG 57, the RST 58 and the SEL 60, respectively. The drive signal S52, S53, S55, S57, S58, and S60 are each a pulse signal in which a high level state is an active state (ON state) and a low level state is a non-active state (OFF state). It is to be noted that, hereinafter, bringing a drive signal into an active state is also referred to as turning a drive signal ON, and bringing a drive signal into a non-active state is also referred to as turning a drive signal OFF.

The photoelectric conversion section 51 is, for example, a photoelectric conversion element including a P-N junction photodiode, and receives light from a subject and generates and accumulates electric charge corresponding to an amount of the light reception by means of photoelectric conversion.

The TRX 52 is coupled between the photoelectric conversion section 51 and the TRM 53, and transfers electric charge accumulated in the photoelectric conversion section 51 to the MEM 54 in response to the drive signal S52 to be applied to the gate electrode of the TRX 52.

The TRM 53 controls a potential of the MEM 54 in response to the drive signal S53 to be applied to the gate electrode of the TRM 53. For example, when the drive signal S53 is turned ON and the TRM 53 is turned ON, the potential of the MEM 54 is deepened. In addition, when the S53 is turned OFF and the TRM 53 is turned OFF, the potential of the MEM 54 is shallowed. When the drive signal S52 and the drive signal S53 are turned ON and the TRX 52 and the TRM 53 are turned ON, electric charge accumulated in the photoelectric conversion section 51 is transferred to the MEM 54 via the TRX 52 and the TRM 53.

The MEM 54 is a region that temporarily holds electric charge accumulated in the photoelectric conversion section 51 in order to achieve the global shutter function.

The TRG 55 is coupled between the TRM 53 and the FD 56, and transfers the electric charge held in the MEM 54 to the FD 56 in response to the drive signal S55 to be applied to the gate electrode of the TRG 55. For example, when the drive signal S53 is turned OFF; the TRM 53 is turned OFF; the drive signal S55 is turned ON; and the TRG 55 is turned ON, the electric charge held in the MEM 54 is transferred to the FD 56 via the TRM 53 and the TRG 55.

The FD 56 is a floating diffusion region that converts the electric charge transferred from the MEM 54 via the TRG 55 into an electric signal (e.g., a voltage signal) to be outputted. The RST 58 is coupled to the FD 56, and a vertical signal line VSL is coupled to the FD 56 via the AMP 59 and the SEL 60.

The OFG 57 has a drain coupled to a power supply VDD and a source coupled to a wiring line between the TRX 52 and the TRM 53. In response to the drive signal S57 to be applied to a gate electrode of the OFG 57, the OFG 57 initializes, i.e., resets the photoelectric conversion section 51. For example, when the drive signal S52 and the drive signal S57 are turned ON and the TRX 52 and the OFG 57 are turned ON, a potential of the photoelectric conversion section 51 is reset to a voltage level of the power supply VDD. That is, the photoelectric conversion section 51 is initialized.

In addition, the OFG 57 forms an overflow path between the TRX 52 and the power supply VDD, and discharges electric charge overflowed from the photoelectric conversion section 51 to the power supply VDD.

The RST 58 has a drain coupled to the power supply VDD and a source coupled to the FD 56. In response to the drive signal S58 to be applied to a gate electrode of the RST 58, the RST 58 initializes, i.e., resets each region from the MEM 54 to the FD 56. For example, when the drive signal S55 and the drive signal S58 are turned ON and the TRG 55 and the RST 58 are turned ON, potentials of the MEM 54 and the FD 56 are reset to the voltage level of the power supply VDD. That is, the MEM 54 and the FD 56 are initialized.

The AMP 59 has a gate electrode coupled to the FD 56 and a drain coupled to the power supply VDD, and serves as an input section of a source follower circuit that reads the electric charge obtained by photoelectric conversion at the photoelectric conversion section 51. That is, a source of the AMP 59 is coupled to the vertical signal line VSL via the SEL 60 to thereby cause the AMP 59 to configure a source follower circuit together with a constant current source coupled to one end of the vertical signal line VSL.

The SEL 60 is coupled between the source of the AMP 59 and the vertical signal line VSL, and the gate electrode of the SEL 60 is supplied with the drive signal S60 as a selection signal. When the drive signal S60 is turned ON, the SEL 60 is brought into an electrically-conductive state, and the sensor pixel 121 provided with the SEL 60 is brought into a selected state. When the sensor pixel 121 is in the selected state, a pixel signal outputted from the AMP 59 is read by the column signal processing section 114 via the vertical signal line VSL.

In addition, in the pixel array section 111, the multiple pixel drive lines 122 are wired for respective pixel rows, for example. Then, the drive signals S52, S53, S55, S57, S58, and S60 are supplied to selected sensor pixels 121 from the vertical drive section 112 through the multiple pixel drive lines 122.

It is to be noted that the pixel circuit illustrated in FIG. 2 is an example of a pixel circuit that is able to be used in the pixel array section 111, and it is also possible to use a pixel circuit having another configuration. In addition, hereinafter, each transistor of the RST 58, the AMP 59, and the SEL 60 is referred to as a pixel transistor.

Figure 3:
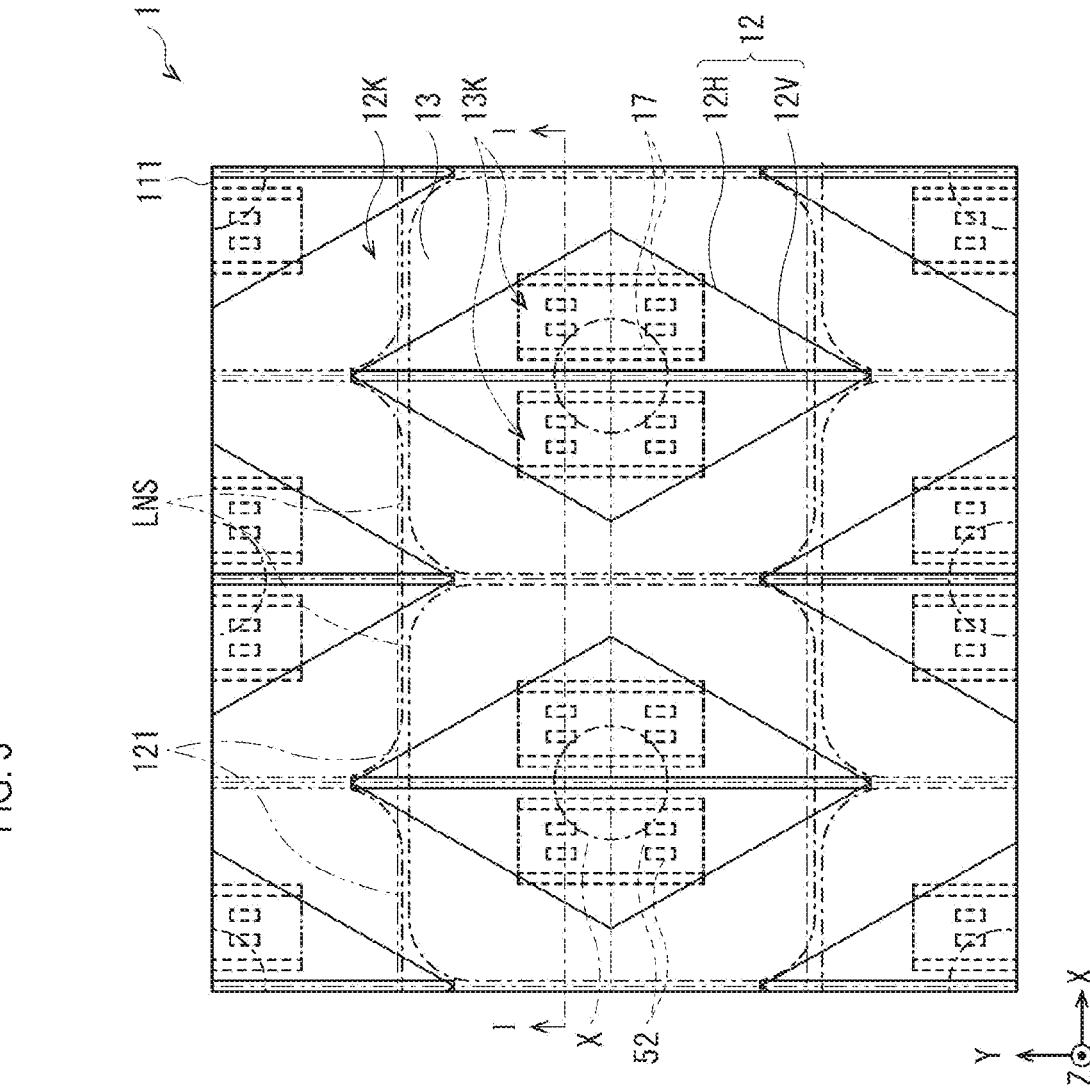
FIG. 3 is a planar schematic view of an example of a configuration of a pixel array section in the imaging device illustrated in FIG. 1.
Figure 4:
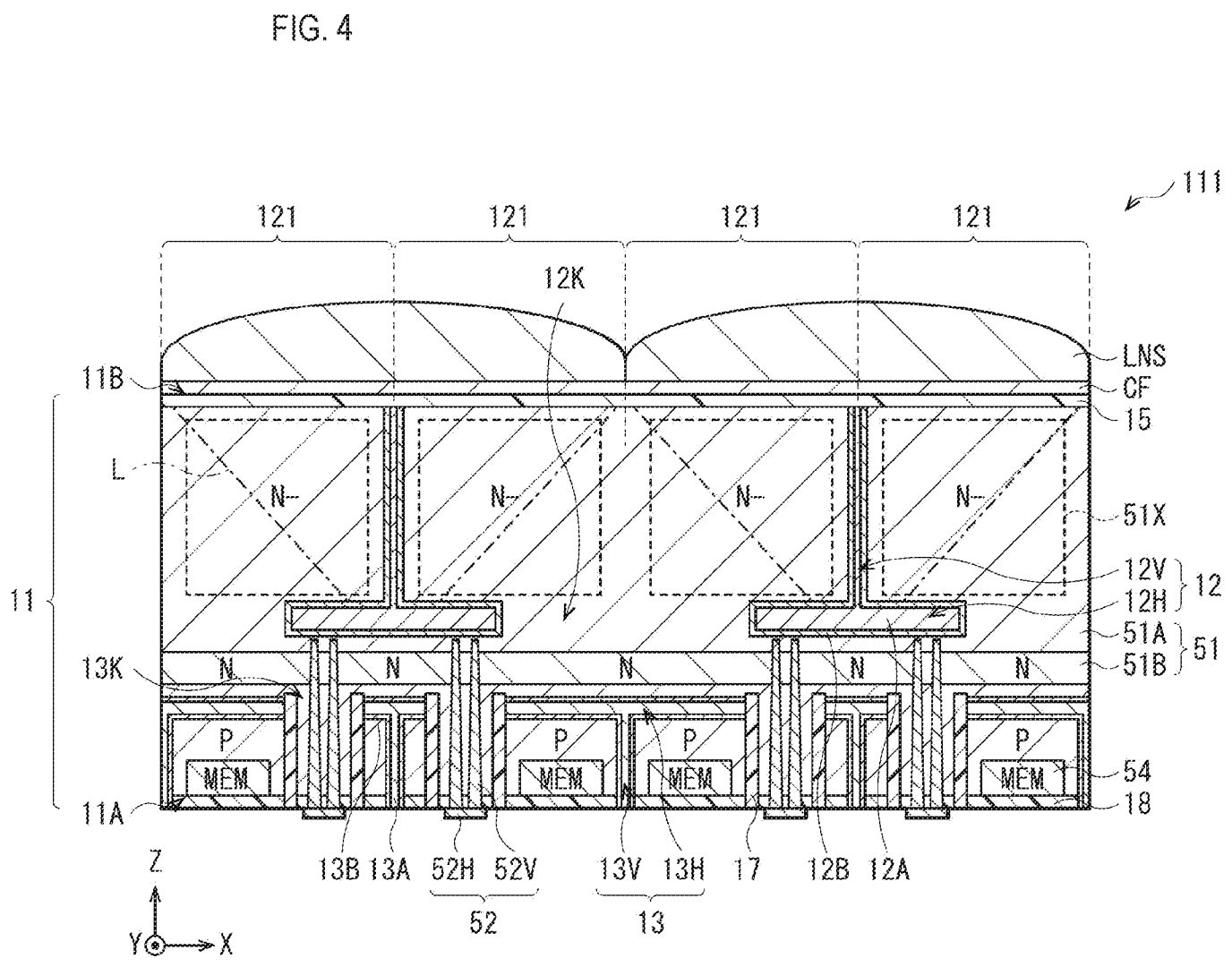

FIG. 3 schematically illustrates an example of a planar configuration of the pixel array section 111 in the imaging device 1. FIG. 4 schematically illustrates a cross-sectional configuration of the pixel array section 111 taken along a line I-I illustrated in FIG. 3. FIG. 3 illustrates, among the multiple sensor pixels 121 in the imaging device 1, the total of 16 sensor pixels 121 of which four sensor pixels are arranged in array each in the row direction (an X-axis direction) and in the column direction (a Y-axis direction). However, other sensor pixels 121 in the imaging device 1 also have substantially the same configuration as that illustrated in FIG. 3. In addition, in the present specification, a plane on which the semiconductor substrate 11 extends is defined as an XY plane, and a thickness direction of the semiconductor substrate 11 is defined as a Z-axis direction.

It is to be noted that the symbols "P" and "N" in the diagram represent a P type semiconductor region and an N type semiconductor region, respectively. Further, an ending "+" and "—" in symbols of "P++", "P+", "P−", and "P−−" each represent an impurity concentration of the P type semiconductor region. Similarly, the ending "+" and "—" in symbols of "N++", "N+", "N−" and "N−−" each represent an impurity concentration of the N type semiconductor region. Here, more numbers of "+" indicates higher impurity concentration, and more numbers of "−" indicate lower impurity concentration. The same applies to the drawings as described hereinafter.

The imaging device 1 includes the semiconductor substrate 11, the photoelectric conversion section 51 embedded in the semiconductor substrate 11, the TRX 52, the TRM 53, the MEM 54, the TRG 55, the OFG 57, light-blocking sections 12 and 13, an etching stopper 17, a color filter CF, and a light-receiving lens LNS. It is to be noted that, in the imaging device 1, a back surface 11B serves as a light-receiving surface thereof.

The semiconductor substrate 11 includes, for example, an Si (111) substrate. The Si (111) substrate refers to a single-crystal silicon substrate having a crystal orientation of (111). The semiconductor substrate 11 includes the back surface 11B which is a light-receiving surface for receiving light from a subject transmitted through the light-receiving lens LNS and the color filter CF, and a front surface 11A opposed to the back surface 11B.

The photoelectric conversion section 51 includes, for example, an N− type semiconductor region 51A and an N type semiconductor region 51B, in order from a position close to the back surface 11B. After light incident on the back surface 11B is photoelectrically converted to generate electric charge in the N− type semiconductor region 51A, the electric charge is accumulated in the N type semiconductor region 51B. It is to be noted that a boundary between the N− type semiconductor region 51A and the N type semiconductor region 51B is not necessarily clear; for example, it is sufficient for N type impurity concentration to be gradually increased from the N– type semiconductor region 51A toward the N type semiconductor region 51B.

The light-blocking section 12 is a member that functions to hinder light from being incident on the MEM 54. As illustrated in FIG. 4, the light-blocking section 12 is positioned between the photoelectric conversion section 51 (a photoelectric conversion region 51X) and the MEM 54 in the Z-axis direction, and is provided to allow light L transmitted through the light-receiving lens LNS to be condensed on a substantial geometric center thereof, as illustrated in FIGS. 3 and 4. Specifically, the light-blocking section 12 includes, for example, a horizontal light-blocking portion 12H that is provided on a side opposite to the back surface 11B of the semiconductor substrate 11 as viewed from the photoelectric conversion region 51X and extends along a horizontal plane (XY plane), and a vertical light-blocking portion 12V that extends along a YZ plane to be orthogonal to the horizontal light-blocking portion 12H.

Figure 5:
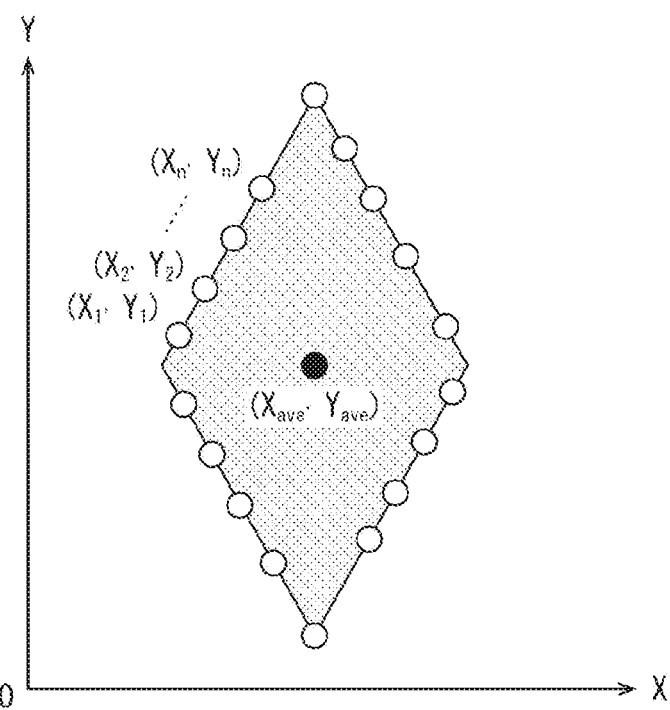
FIG. 5 is an explanatory view of a method for calculating a geometric center of a light-blocking section.

Here, the "geometric center" corresponds to a position of an arithmetic average taken across all points belonging to the contour of a target. In addition, the geometric center corresponds to the center of gravity in a case where the density of an object to be target is uniform. The geometric center can be determined, for example, as follows. First, as illustrated in FIG. 5, a coordinate system of the contour of the target is created, and coordinates $(X_1, Y_1)$, $(X_2, Y_2)$, . . ., and $(X_n, Y_n)$ of all points belonging to the contour of the target are determined. Next, an average value $X_{ave}$ of $X_1$ to $X_n$ and an average value $Y_{ave}$ of $Y_1$ to $Y_n$ are each calculated. This allows coordinates $(X_{ave}, Y_{ave})$ of the geometric center to be obtained.

The horizontal light-blocking portion 12H corresponds to a specific example of a "first light-blocking section" of the present disclosure. As illustrated in FIG. 4, the horizontal light-blocking portion 12H is positioned between the photoelectric conversion region 51X and the MEM 54 in the Z-axis direction, and extends on the XY plane. Specifically, the horizontal light-blocking portion 12H extends, in a substantially rhombic shape, on the XY plane from the center of four sensor pixels 121, as one pixel unit, arranged in two rows and two columns, as illustrated in FIG. 3. In addition, the horizontal light-blocking portion 12H is provided for each pixel unit described above, and is provided, in the pixel array section 111, at a position shifted in the row direction by one sensor pixel 121 for each row, for example, as illustrated in FIG. 3. With respect to the horizontal light-blocking portion 12H provided in this manner, the light-receiving lens LNS is provided to be substantially opposed to the horizontal light-blocking portion 12H, although detailed description is given later. Consequently, the light L transmitted through the light-receiving lens LNS and incident from back surface 11B to be transmitted through the photoelectric conversion region 51X without being absorbed by the photoelectric conversion region 51X is condensed on the substantial geometric center (a light-condensing spot X) of the horizontal light-blocking portion 12H, as illustrated in FIG. 3. That is, the horizontal light-blocking portion 12H functions to suppress generation of a noise due to incidence of light transmitted through the photoelectric conversion region 51X on the MEM 54. An opening 12K is provided between adjacent horizontal light-blocking portions 12H provided for each pixel unit. This opening 12K corresponds to a specific example of a "first opening" of the present disclosure.

The vertical light-blocking portion 12V corresponds to a specific example of a "third light-blocking section" of the present disclosure. The vertical light-blocking portion 12V is a wall portion provided at a boundary portion between adjacent sensor pixels 121 in the X-axis direction in a plan view and extending in the Z-axis direction from a side of the back surface 11B of the semiconductor substrate 11, as illustrated in FIGS. 3 and 4. The vertical light-blocking portion 12V is provided continuously for every two sensor pixels 121 adjacent to each other in the Y-axis direction in the pixel unit provided with the horizontal light-blocking portion 12H. The vertical light-blocking portion 12V functions to prevent generation of a noise such as color mixture by incidence of leakage light from the adjacent sensor pixel 121 on the photoelectric conversion section 51.

The light-blocking section 12 has a two-layer structure of an inner layer portion 12A and an outer layer portion 12B surrounding the periphery thereof. The inner layer portion 12A includes, for example, a material having a light-blocking property including at least one of a single metal, a metal alloy, a metal nitride, or a metal silicide. More specifically, examples of a constituent material of the inner layer portion 12A include Al (aluminum), Cu (copper), Co (cobalt), W (tungsten), Ti (titanium), Ta (tantalum), Ni (nickel), Mo (molybdenum), Cr (chromium), Ir (iridium), platinum iridium, TiN (titanium nitride), and a tungsten silicon compound. Among those, Al (aluminum) is the most optically preferable constituent material. It is to be noted that the inner layer portion 12A may be configured by graphite or a low refractive index material. The outer layer portion 12B is configured by, for example, an insulating material such as SiOx (silicon oxide). The outer layer portion 12B secures an electric insulation property between the inner layer portion 12A and the semiconductor substrate 11.

The light-blocking section 12 can be formed from the side of the back surface 11B of the semiconductor substrate 11, for example, by a combination of dry etching and wet etching. In the wet etching, a predetermined alkaline aqueous solution is used as an etching solution. As the alkaline aqueous solution, KOH, NaOH, CsOH, or the like is applicable for an inorganic solution, and EDP (ethylenediamine pyrocatechol aqueous solution), $N_2H_4$ (hydrazine), $NH_4OH$ (ammonium hydroxide), TMAH (tetramethylammonium hydroxide), or the like is applicable for an organic solution. Here, crystalline anisotropic etching utilizing properties of different etching rates is performed depending on a plane orientation of the Si (111). Specifically, in the Si (111) substrate, an etching rate in a <110> direction is sufficiently higher than an etching rate in a <111> direction. Therefore, in the present modification example, the etching proceeds in the X-axis direction, whereas almost no etching proceeds in the Y-axis direction and the Z-axis direction. As a result, a space 12Z that is surrounded by a first crystal plane 11S1, a second crystal plane 11S2, and a third crystal plane 11S3 and that communicates with a trench 12T is formed inside the semiconductor substrate 11 that is the Si (111) substrate. It is to be noted that a distance of progress of etching in the <110> direction can be adjusted by the processing time for etching using an alkaline aqueous solution on the semiconductor substrate 11.

In the same manner as the light-blocking section 12, a light-blocking section 13 is a member that functions to prevent incidence of light on the MEM 54; as illustrated in FIG. 4, the light-blocking section 13 is positioned closer to the MEM 54 than the light-blocking section 12 in the Z-axis direction, and is provided, for example, to surround the MEM 54. Specifically, the light-blocking section 13 includes, for example, a horizontal light-blocking portion 13H that is provided on the side opposite to the back surface 11B of the semiconductor substrate 11 as viewed from the photoelectric conversion section 51 (photoelectric conversion region 51X) and extends along the horizontal plane (XY plane), and a vertical light-blocking portion 13V that extends along the YZ plane to be orthogonal to the horizontal light-blocking portion 13H.

The horizontal light-blocking portion 13H corresponds to a specific example of a "second light-blocking section" of the present disclosure. The horizontal light-blocking portion 13H is provided, for example, at a position opposed to the opening 12K of the horizontal light-blocking portion 12H of the light-blocking section 12 to cover the MEM 54 in a plan view. Specifically, the horizontal light-blocking portion 13H is positioned between the photoelectric conversion section 51 (photoelectric conversion region 51X) and the MEM 54 in the Z-axis direction as illustrated in FIG. 4, and is provided across the entire XY plane in the pixel array section 111 except an opening 13K as illustrated in FIG. 3. Consequently, light transmitted through the photoelectric conversion region 51X without being absorbed by the photoelectric conversion region 51X and not blocked by the horizontal light-blocking portion 12H of the light-blocking section 12 is reflected by the horizontal light-blocking portion 13H of the light-blocking section 13, and is incident again on the photoelectric conversion section 51. That is, the horizontal light-blocking portion 13H functions as a reflector, and functions to further suppress generation of a noise due to incidence of light transmitted through the photoelectric conversion section 51 on the MEM 54. It is to be noted that the horizontal light-blocking portions 12H and 13H may have a light-absorbing property instead of light reflectivity.

The vertical light-blocking portion 13V corresponds to a specific example of a "fourth light-blocking section" of the present disclosure. The vertical light-blocking portion 13V is a wall portion provided, for example, at a boundary portion between adjacent sensor pixels 121 in the X-axis direction and extending in the Y-axis direction, as illustrated in FIG. 4. The vertical light-blocking portion 13V is exposed to the front surface 11A of the Si (111) substrate. In the same manner as the vertical light-blocking portion 12V, the vertical light-blocking portion 13V functions to prevent generation of a noise such as color mixture by incidence of leakage light from the adjacent sensor pixel 121 on the photoelectric conversion section 51.

In the same manner as the light-blocking section 12, the light-blocking section 13 has a two-layer structure of an inner layer portion 13A and an outer layer portion 13B surrounding the periphery thereof. The inner layer portion 13A includes, for example, a material having a light-blocking property including at least one of a single metal, a metal alloy, a metal nitride, or a metal silicide. More specifically, examples of a constituent material of the inner layer portion 13A include Al (aluminum), Cu (copper), Co (cobalt), W (tungsten), Ti (titanium), Ta (tantalum), Ni (nickel), Mo (molybdenum), Cr (chromium), Ir (iridium), platinum iridium, TiN (titanium nitride), and a tungsten silicon compound. Among those, Al (aluminum) is the most optically preferable constituent material. It is to be noted that the inner layer portion 13A may be configured by graphite or a low refractive index material. The outer layer portion 13B is configured by, for example, an insulating material such as SiOx (silicon oxide). The outer layer portion 13B secures an electric insulation property between the inner layer portion 13A and the semiconductor substrate 11.

In the same manner as the light-blocking section 12, the light-blocking section 13 can be formed from a side of the front surface 11A of the semiconductor substrate 11, for example, by a combination of dry etching and wet etching.

The etching stopper 17 is provided at both ends of the opening 13K in the X-axis direction. The etching stopper 17 has a function of inhibiting progress of etching upon formation of the horizontal light-blocking portion 13H by wet etching processing. The etching stopper 17 exhibits, for example, etching resistance to an etching solution that is able to perform etching in the <110> direction of the semiconductor substrate 11, for example, to an alkaline aqueous solution. It is possible to use, as the etching stopper 17, for example, an impurity element such as B (boron), a crystal defect structure having undergone hydrogen ion implantation, an insulator such as an oxide, or the like.

Each gate electrode in the TRX 52, the TRM 53, the TRG 55, and the OFG 57 is provided on the front surface 11A of the semiconductor substrate 11, with an insulating layer 18 interposed therebetween. In addition, the MEM 54, which is the N type semiconductor region, is embedded in the semiconductor substrate 11, and is disposed between the front surface 11A and the horizontal light-blocking portion 13H. Further, a P type semiconductor region 16 is provided between an MRM 54 and the front surface 11A.

The TRX 52 includes, as gate electrodes, a horizontal terminal section 52H and a vertical terminal section 52V. The horizontal terminal section 52H is provided on the front surface 11A of the semiconductor substrate 11. The vertical terminal section 52V extends along the Z-axis direction from the horizontal terminal section 52H downward, and penetrates the opening 13K and the N type semiconductor region 51B sequentially to reach the inside of the N– type semiconductor region 51A. The vertical terminal section 52V is provided in the Si-remaining region 22 other than the region occupied by the horizontal light-blocking portion 13H (region corresponding to the opening 13K) in the horizontal plane. The TRX 52 is a component through which electric charge travels from the photoelectric conversion section 51 to the MEM 54.

The imaging device 1 further includes a fixed-charge film 15 provided between the photoelectric conversion section 51 and the back surface 11B. The fixed-charge film 15 is exposed to the back surface 11B. The fixed-charge film 15 has negative fixed electric charge in order to suppress generation of a dark current caused by an interface state of the back surface 11B, which is the light-receiving surface of the semiconductor substrate 11. An electric field induced by the fixed-charge film 15 causes an hole accumulation layer to be formed in the vicinity of the back surface 11B of the semiconductor substrate 11. The hole accumulation layers suppress generation of electrons from the back surface 11B.

The color filter CF is provided to be in contact with the fixed-charge film 15.

The light-receiving lens LNS is provided on a side of the light-receiving surface of the semiconductor substrate 11. Specifically, the light-receiving lens LNS is positioned on a side opposite to the fixed-charge film 15 as viewed from the color filter CF, and is provided to be in contact with the color filter CF.

Multiple light-receiving lenses LNS are arranged in array in the pixel array section 111 in which the multiple sensor pixels 121 are arranged each in the row direction (X-axis direction) and in the column direction (Y-axis direction). Specifically, one light-receiving lens LNS is provided for the four sensor pixels 121 arranged in two rows and two columns. In addition, as illustrated in FIGS. 3 and 4, the light-receiving lens LNS is arranged to allow the light L transmitted through the light-receiving lens LNS to be condensed on the substantial geometric center of the light-blocking section 12. That is, as described above, in the present embodiment, one light-receiving lens LNS is provided for every four sensor pixels 121 (pixel unit) arranged in two rows and two columns to be substantially opposed to the horizontal light-blocking portion 12H. In other words, the light-receiving lens LNS is provided to allow the focus of the light-receiving lens LNS and the geometric center of the horizontal light-blocking portion 12H to substantially coincide with each other, in a plan view.

It is to be noted that, in the pixel array section 111, some of the sensor pixels 121 arranged in array in the lateral direction (row direction) and the longitudinal direction (column direction) may be image-plane phase difference pixels. The image-plane phase difference pixel divides a pupil region of an imaging lens, and photoelectrically converts a subject image from the divided pupil region to generate a signal for detecting a phase difference. The image-plane phase difference pixel is discretely arranged between the sensor pixels 121, for example.

[Workings and Effects of Imaging Device 1]

As described above, in the imaging device 1 of the present embodiment, the light-blocking section 12 extending in an in-plane direction (XY-direction) of the semiconductor substrate 11 is provided between the photoelectric conversion section 51 (photoelectric conversion region 51X) and the MEM 54 provided in the semiconductor substrate 11, and the light-receiving lens LNS is provided to allow the light L to be condensed on the substantial geometric center of the light-blocking section 12, in a plan view, on the side of the back surface 11B which is the light-receiving surface of the semiconductor substrate 11.

Specifically, the light-blocking section 12 (horizontal light-blocking portion 12H) is provided in a substantially rhombic shape on the XY plane from the center of the four sensor pixels 121 arranged in two rows and two columns, in the pixel array section 111 in which the multiple sensor pixels 121 are arranged each in the row direction (X-axis direction) and in the column direction (Y-axis direction). In the same manner as the horizontal light-blocking portion 12H, one light-receiving lens LNS is provided for the four sensor pixels 121 arranged in two rows and two columns, to be substantially opposed to the horizontal light-blocking portion 12H. Consequently, the light L transmitted through the light-receiving lens LNS and incident from the back surface 11B to be transmitted through the photoelectric conversion region 51X without being absorbed by the photoelectric conversion region 51X is condensed on the substantial geometric center of the horizontal light-blocking portion 12H.

As described above, in the imaging device 1 of the present embodiment, the light (leaked light) transmitted through the light-receiving lens LNS and incident from the back surface 11B to be transmitted through the photoelectric conversion region 51X without being absorbed by the photoelectric conversion region 51X is prevented from entering the MEM 54. This reduces the generation of a noise due to incidence of the leaked light on the MEM 54. That is, it is possible to improve parasitic light sensitivity (PLS).

In addition, in the imaging device 1 of the present embodiment, as described above, the horizontal light-blocking portion 12H and the light-receiving lens LNS are provided for every four sensor pixels 121 arranged in an in two rows and two columns to cause the light L to be condensed on the substantial geometric center of the horizontal light-blocking portion 12H in a plan view. Therefore, it is possible to prevent light leaked from one sensor pixel 121 to another sensor pixel 121 adjacent thereto from being incident on the photoelectric conversion section 51 of the other sensor pixel 121. Thus, it is possible to improve oblique incidence characteristics. That is, it is possible to prevent generation of a noise such as color mixture. In addition, it is possible to achieve miniaturization.

Further, in the imaging device 1 of the present embodiment, one light-receiving lens LNS is provided for the four sensor pixels 121 arranged in two rows and two columns, as described above. Therefore, when the image-plane phase difference pixel is provided between the sensor pixels 121 arranged in array as described above, it is possible to improve image-plane phase difference characteristics.

Furthermore, in the imaging device 1 of the present embodiment, the horizontal light-blocking portion 13H is provided to cover a side of a light-receiving surface of the MEM 54, thus making it possible to avoid an influence of an electric field generated in each transistor (e.g., TRX 52, etc.) in each of the sensor pixels 121 over the photoelectric conversion section 51. That is, it is possible to prevent a dark current generated by the electric field of each transistor from flowing into the photoelectric conversion section 51 and thus generating a noise.

Further, in the imaging device 1 of the present embodiment, the Si (111) substrate is used as the semiconductor substrate 11, and thus channel mobility becomes higher than that in a case of using an Si (100) substrate, thus making it possible to expect an improvement in charge transfer characteristics.

Next, description is given of a second embodiment and Modification Examples 1 to 6. Hereinafter, components similar to those of the foregoing first embodiment are denoted by the same reference numerals, and descriptions thereof are omitted as appropriate.

2. Second Embodiment

[Configuration of Imaging Device 2]

Figure 6:
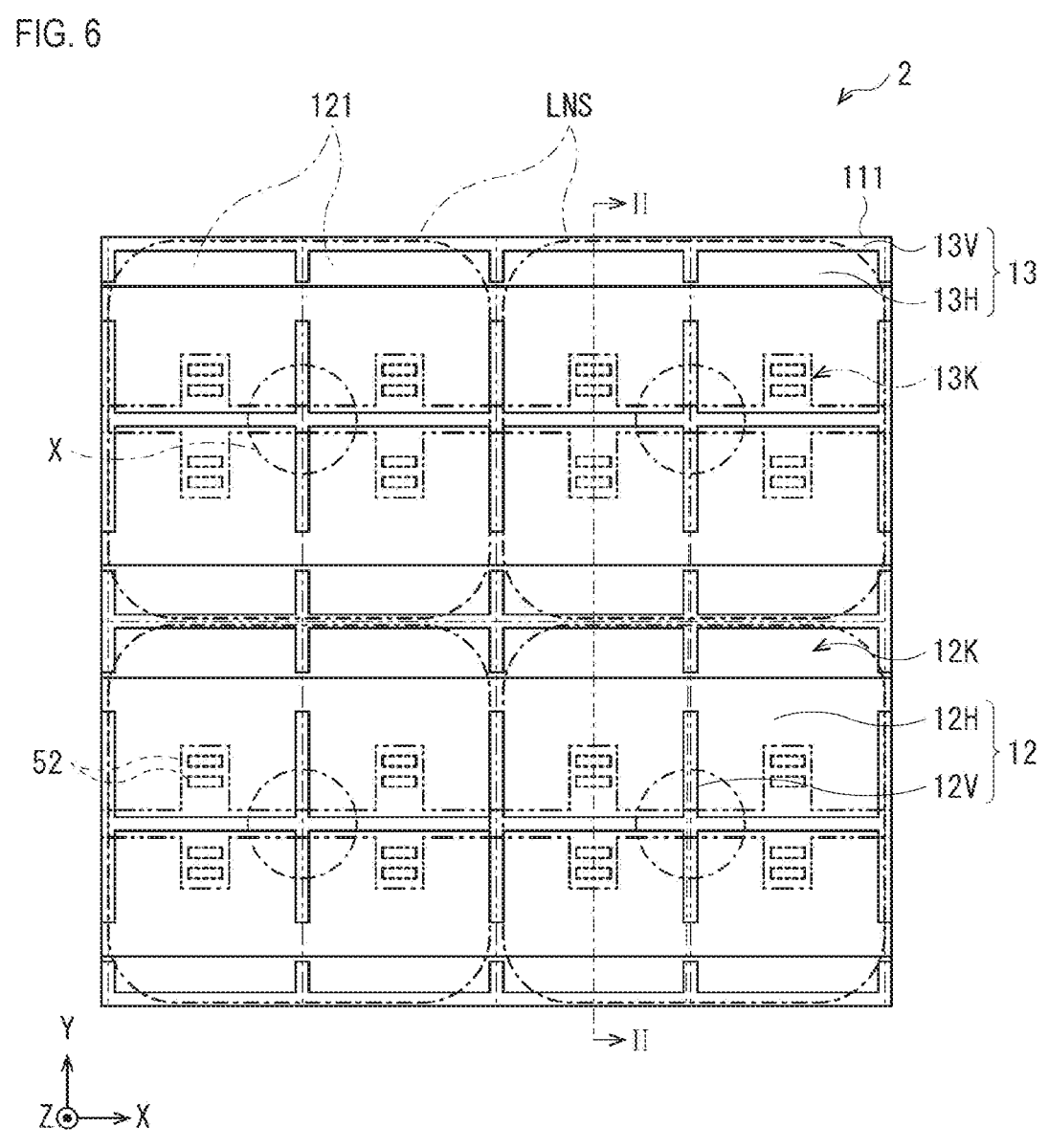
Figure 7:
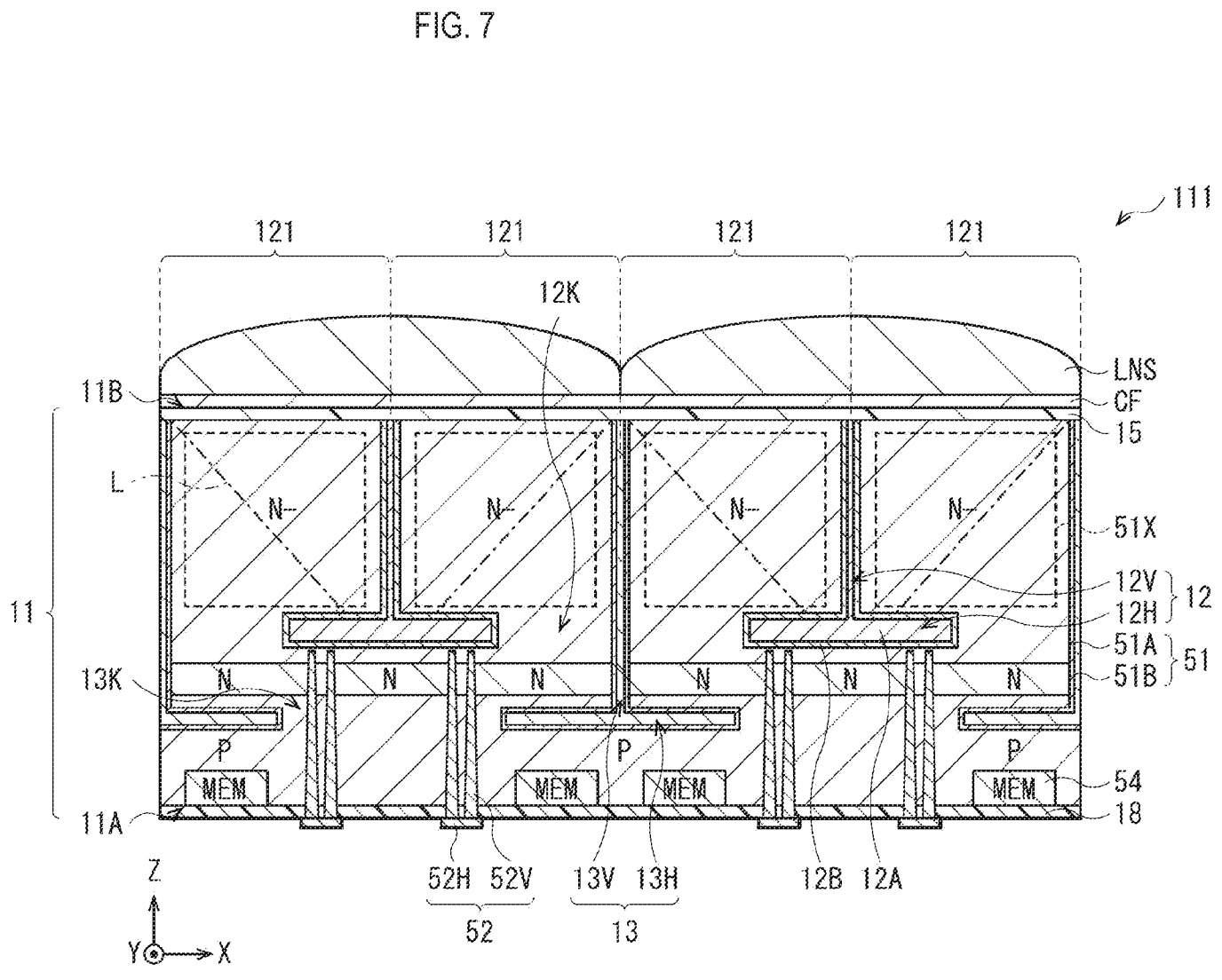

FIG. 6 schematically illustrates an example of a planar configuration of the pixel array section 111 in an imaging device 2 according to the second embodiment of the present disclosure. FIG. 7 schematically illustrates a cross-sectional configuration of the pixel array section 111 taken along a line II-II illustrated in FIG. 6.

In the imaging device 1 according to the foregoing first embodiment, the light-blocking section 12 (horizontal light-blocking portion 12H) in a rhombic shape is provided for every four sensor pixels 121 (pixel unit) arranged in two rows and two columns. In contrast, in the imaging device 2 according to the present embodiment, the horizontal light-blocking portion 12H extends in one direction (e.g., row direction (X-axis direction)), and is shared by pixel units arranged in the same direction. In addition, the light-receiving lenses LNS of the present embodiment are arranged one by one, in the row direction (X-axis direction) and the column direction (Y-axis direction), for four sensor pixels 121 (pixel unit) arranged in two rows and two columns. Consequently, the light L transmitted through the light-receiving lens LNS and incident from the back surface 11B to be transmitted through the photoelectric conversion region 51X without being absorbed by the photoelectric conversion region 51X is condensed along the geometric center of the horizontal light-blocking portion 12H or a symmetrical axis of the horizontal light-blocking portion 12H. Except for these points, the imaging device 2 according to the present embodiment has substantially similar configurations, in other points, to those of the imaging device 1 according to the foregoing first embodiment.

As described above, in the imaging device 2 of the present embodiment, the light-blocking section 12 (horizontal light-blocking portion 12H) is formed to extend in the row direction (X-axis direction), for example, and is shared by the pixel units arranged in the same direction; the light L transmitted through the light-receiving lens LNS and incident from the back surface 11B to be transmitted through the photoelectric conversion region 51X without being absorbed by the photoelectric conversion region 51X is condensed along the geometric center of the horizontal light-blocking portion 12H or the symmetrical axis of the horizontal light-blocking portion 12H. Consequently, the light (leaked light) transmitted through the photoelectric conversion region 51X without being absorbed by the photoelectric conversion region 51X is prevented from entering the MEM 54. This reduces the generation of a noise due to incidence of the leaked light on the MEM 54. That is, it is possible to improve the PLS in the same manner as the foregoing first embodiment.

It is to be noted that, in the imaging device 2 of the present embodiment, the vertical light-blocking portion 13V that abuts on the horizontal light-blocking portion 13H that covers the MEM 54 from the side of the light-receiving surface is provided from the side of the back surface 11B of the semiconductor substrate 11. This allows the vertical light-blocking portions 12V and 13V to be provided at boundary positions between the sensor pixels 121. Thus, it is possible to further prevent the light leaked from one sensor pixel 121 to another sensor pixel 121 adjacent thereto from being incident on the photoelectric conversion section 51 of the other sensor pixel 121. Thus, it is possible to further improve the oblique incidence characteristics, as compared with the imaging device 1 of the foregoing first embodiment.

3. Modification Examples

3-1. Modification Example 1

FIGS. 8A to 8H each schematically illustrate an example of a planar shape of the light-blocking section 12 in an imaging device (e.g., imaging device 1) according to Modification Example 1 of the present disclosure, together with the light-receiving lens LNS and the light-condensing spot X.

The foregoing first embodiment gives the example of providing the horizontal light-blocking portion 12H in the rhombic shape, but the shape of the horizontal light-blocking portion 12H is not limited thereto. The planar shape of the horizontal light-blocking portion 12H depends on the shape of the vertical light-blocking portion 12V and a forming direction thereof.

Figure 8A:
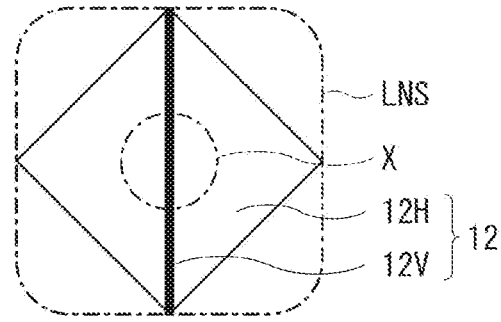
FIG. 8A is a schematic view of an example of a planar shape of a light-blocking section in an imaging device according to Modification Example 1 of the present disclosure.

FIG. 8A illustrates an example in which the vertical light-blocking portion 12V extends in one direction on the XY plane in the same manner as the foregoing first embodiment. In this case, it is highly probable that etching proceeds until a crystal plane of plane index (111) eventually appears to allow for a rhombic shape, but the shape can be changed by adjusting etching time or the like. It is to be noted that further continuing the etching from FIG. 8A causes over-etching, which may lead to a shape different from the rhombic shape.

Figure 8B:
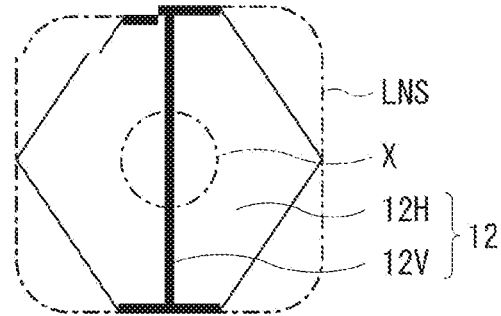
FIG. 8B is a schematic view of another example of the planar shape of the light-blocking section in the imaging device according to Modification Example 1 of the present disclosure.

FIG. 8B illustrates a planar shape of the horizontal light-blocking portion 12H in a case where the vertical light-blocking portion 12V has an I-shape in a plan view. In this case, as illustrated in FIG. 8B, a shape with chamfered two opposite apexes of the rhombic shape may be employed.

Figure 8C:
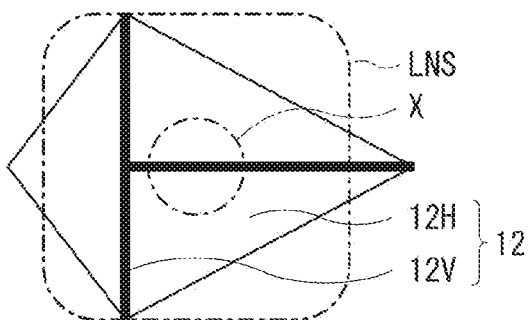
FIG. 8C is a schematic view of another example of the planar shape of the light-blocking section in the imaging device according to Modification Example 1 of the present disclosure.
Figure 8D:
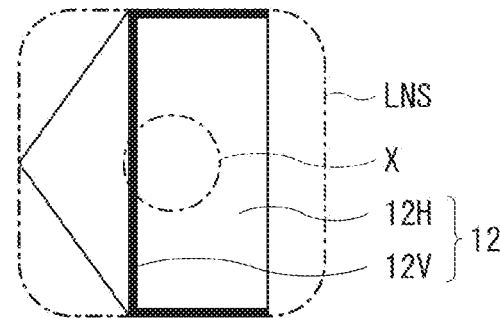
FIG. 8D is a schematic view of another example of the planar shape of the light-blocking section in the imaging device according to Modification Example 1 of the present disclosure.
Figure 8E:
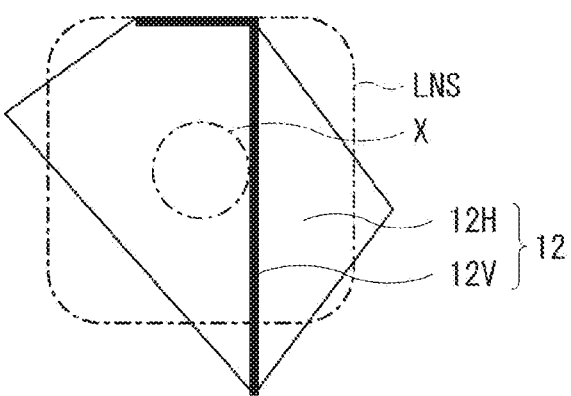
FIG. 8E is a schematic view of another example of the planar shape of the light-blocking section in the imaging device according to Modification Example 1 of the present disclosure.

FIG. 8C illustrates a planar shape of the horizontal light-blocking portion 12H in a case where the vertical light-blocking portion 12V has a "T" shape in a plan view. The horizontal light-blocking portion 12H in this case may have a planar shape in which an end part of the vertical light-blocking portion 12V is eventually a corner, as illustrated in FIG. 8C.

Other than those described above, as illustrated in FIGS. 8D and 8E, designing the shape of the vertical light-blocking portion 12V and a forming direction thereof makes it possible to form the horizontal light-blocking portions 12H having various planar shapes.

Figure 8F:
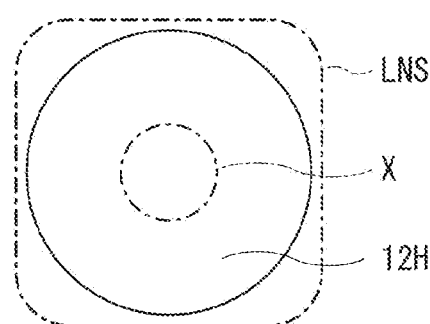
FIG. 8F is a schematic view of another example of the planar shape of the light-blocking section in the imaging device according to Modification Example 1 of the present disclosure.

It is to be noted that the planar shape of the horizontal light-blocking portion 12H is not limited to the polygonal shapes illustrated in FIG. 8A to 8E, and may be a circular shape, for example, as illustrated in FIG. 8F.

Figure 8G:
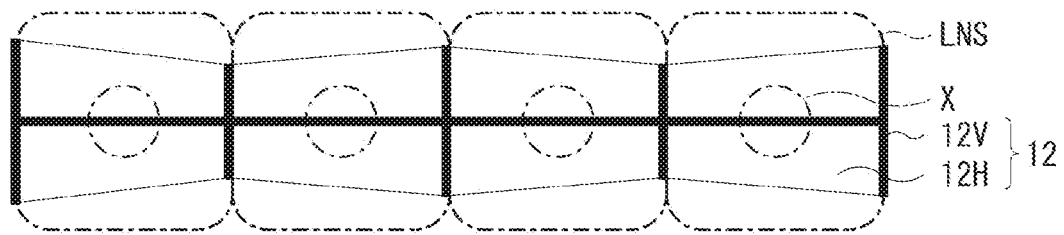
FIG. 8G is a schematic view of another example of the planar shape of the light-blocking section in the imaging device according to Modification Example 1 of the present disclosure.

In addition, although the foregoing second embodiment illustrates the horizontal light-blocking portion 12H that extends in one direction and is shared by pixel units arranged in the same direction, the shape of the horizontal light-blocking portion 12H is not limited thereto. For example, as illustrated in FIG. 8G, a width of the horizontal light-blocking portion 12H extending in one direction of the horizontal light-blocking portion 12H is not necessarily constant; for example, the width of the horizontal light-blocking portion 12H may continuously vary for each of adjacent pixel units.

Figure 8H:
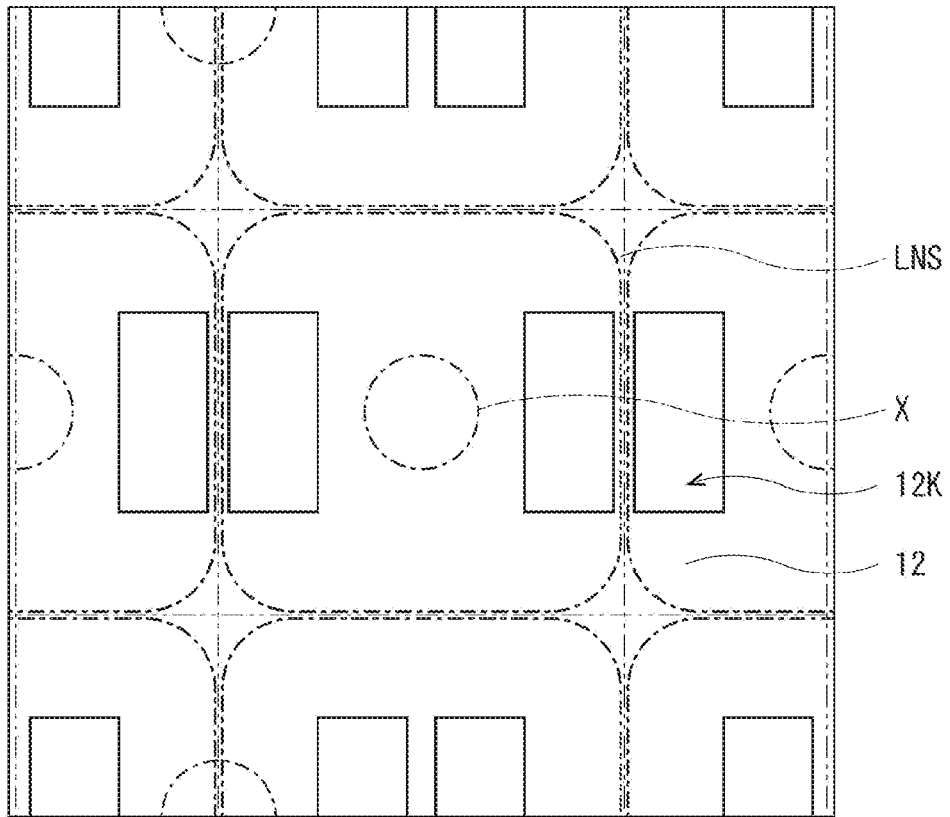
FIG. 8H is a schematic view of another example of the planar shape of the light-blocking section in the imaging device according to Modification Example 1 of the present disclosure.

Furthermore, the foregoing first and second embodiments each illustrate an example in which the multiple horizontal light-blocking portions 12H are provided in the pixel array section 111 for each pixel unit including four sensor pixels arranged in two rows and two columns or for every multiple pixel units arranged in one direction (e.g., a row direction); however, this is not limitative. The horizontal light-blocking portion 12H may be provided across the entire surface of the pixel array section 111, and the opening 12K may be formed at a predetermined position, for example, as illustrated in FIG. 8H.

In any shape of the horizontal light-blocking portion 12H in FIGS. 8A to 8H, the light-receiving lens LNS is arranged to allow the light L transmitted through the light-receiving lens LNS to be condensed on the substantial geometric center of the horizontal light-blocking portion 12H. Consequently, the light (leaked light) transmitted through the light-receiving lens LNS and incident from the back surface 11B to be transmitted through the photoelectric conversion region 51X without being absorbed by the photoelectric conversion region 51X is prevented from entering the MEM 54. This reduces the generation of a noise due to incidence of the leaked light on the MEM 54, thus making it possible to improve the PLS in the same manner as the foregoing first embodiment.

3-2. Modification Example 2

FIGS. 9A to 9E and 10A and 10B each schematically illustrate an example of a planar layout of the light-blocking section 12 (horizontal light-blocking portion 12H) and the light-receiving lens LNS with respect to the sensor pixel 121 in an imaging device according to Modification Example 2 of the present disclosure.

The foregoing first and second embodiments give the example in which four sensor pixels 121 arranged in two rows and two columns are set as one pixel unit and the light-blocking section 12 (horizontal light-blocking portion 12H) and the light-receiving lens LNS are provided for each pixel unit; however, the planar layout of the light-blocking section 12 (horizontal light-blocking portion 12H) and the light-receiving lens LNS is not limited thereto.

Figure 9A:
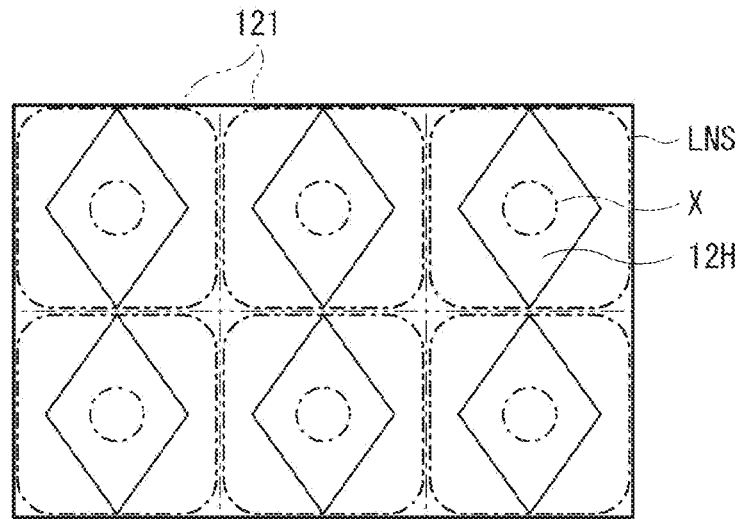
FIG. 9A is a schematic view of an example of a planar layout of a light-blocking section and a light-receiving lens with respect to a sensor pixel in an imaging device according to Modification Example 2 of the present disclosure.
Figure 9B:
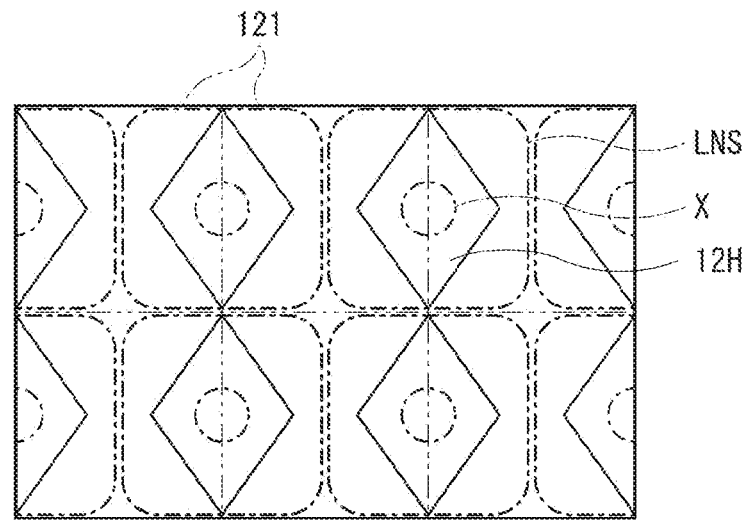
FIG. 9B is a schematic view of another example of the planar layout of the light-blocking section and the light-receiving lens with respect to the sensor pixel in the imaging device according to Modification Example 2 of the present disclosure.
Figure 9C:
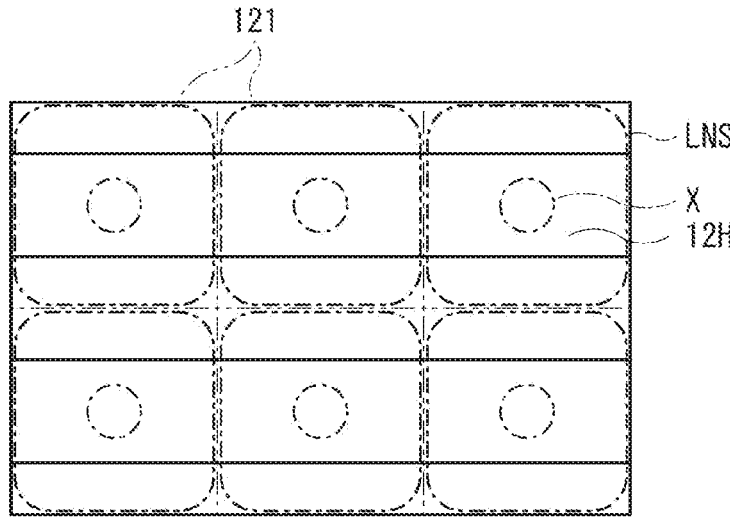
FIG. 9C is a schematic view of another example of the planar layout of the light-blocking section and the light-receiving lens with respect to the sensor pixel in the imaging device according to Modification Example 2 of the present disclosure.
Figure 9D:
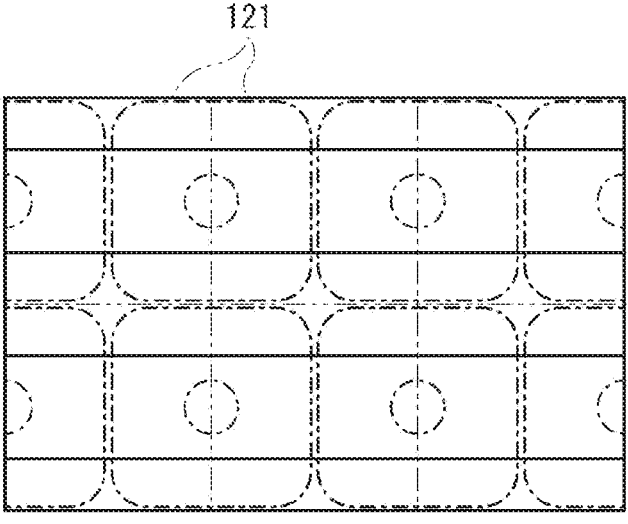
FIG. 9D is a schematic view of another example of the planar layout of the light-blocking section and the light-receiving lens with respect to the sensor pixel in the imaging device according to Modification Example 2 of the present disclosure.
Figure 9E:
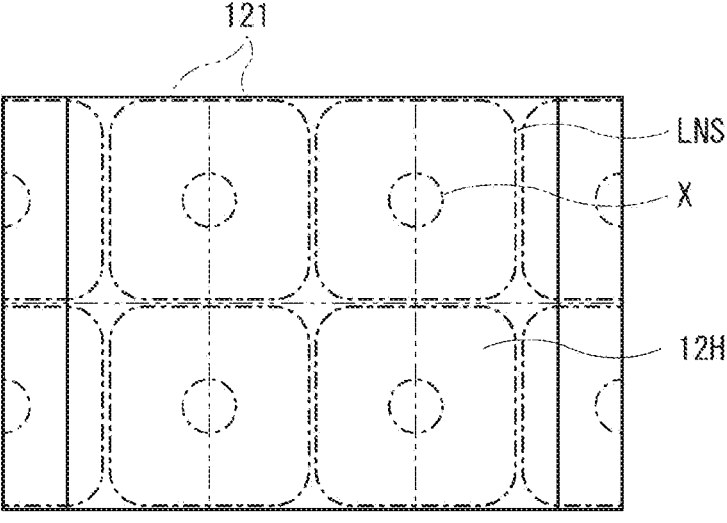
FIG. 9E is a schematic view of another example of the planar layout of the light-blocking section and the light-receiving lens with respect to the sensor pixel in the imaging device according to Modification Example 2 of the present disclosure.

For example, the horizontal light-blocking portion 12H in the rhombic shape and the light-receiving lens LNS may be provided for one sensor pixel 121, for example, as illustrated in FIG. 9A. In addition, the horizontal light-blocking portion 12H in the rhombic shape and the light-receiving lens LNS may be provided to straddle two adjacent sensor pixels 121 as illustrated in FIG. 9B. At that time, as illustrated in FIGS. 9C and 9D, the horizontal light-blocking portion 12H may be the horizontal light-blocking portion 12H extending in one direction (e.g., row direction) illustrated in the foregoing second embodiment. In addition, the horizontal light-blocking portion 12H extending in one direction may extend in the column direction as illustrated in FIG. 9E.

Figure 10A:
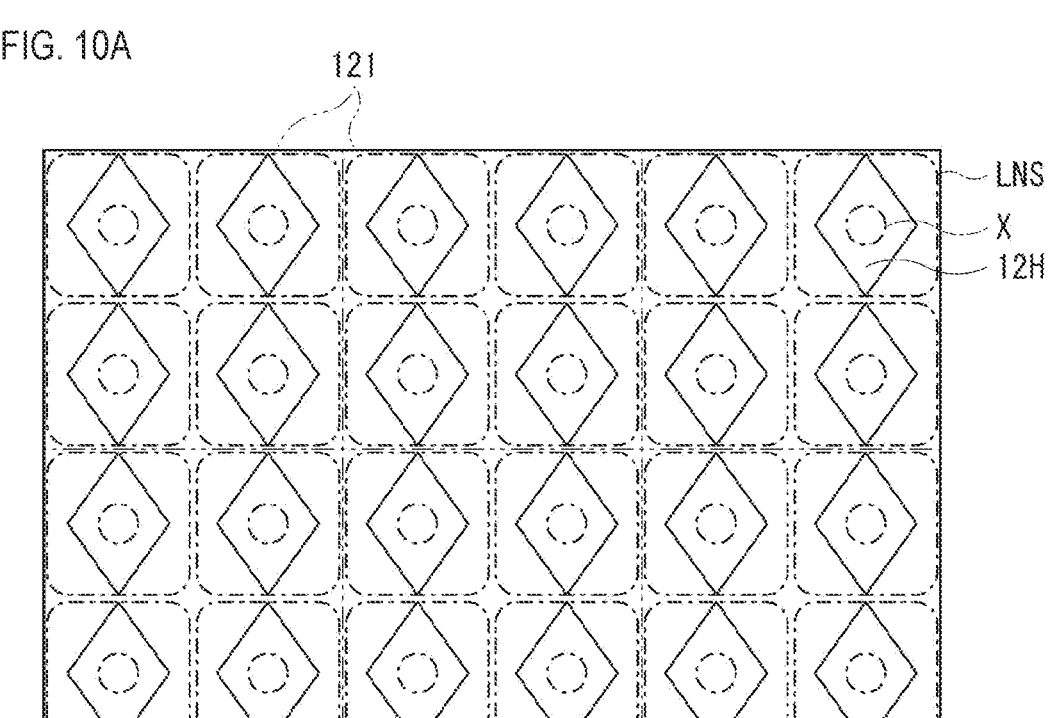
FIG. 10A is a schematic view of another example of the planar layout of the light-blocking section and the light-receiving lens with respect to the sensor pixel in the imaging device according to Modification Example 2 of the present disclosure.
Figure 10B:
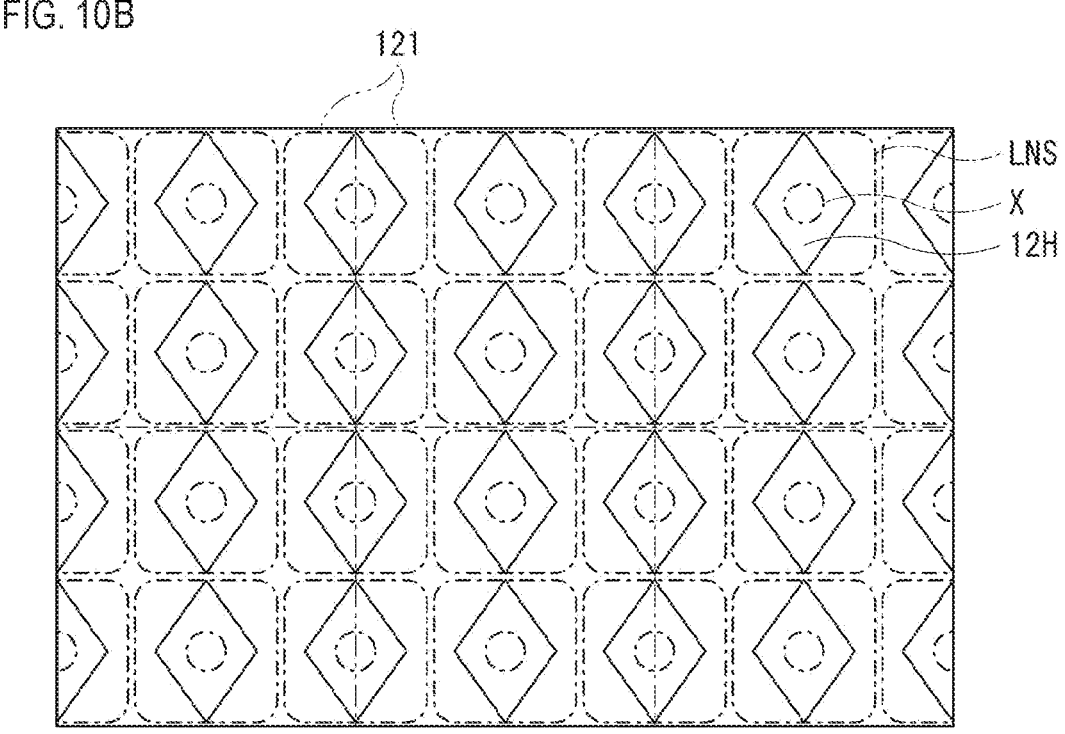
FIG. 10B is a schematic view of another example of the planar layout of the light-blocking section and the light-receiving lens with respect to the sensor pixel in the imaging device according to Modification Example 2 of the present disclosure.

Further, the total of four horizontal light-blocking portions 12H and the total of four light-receiving lenses LNS may each be provided in two rows and two columns for one sensor pixel 121, as illustrated in FIGS. 10A and 10B.

3-3. Modification Example 3

Figure 11A:
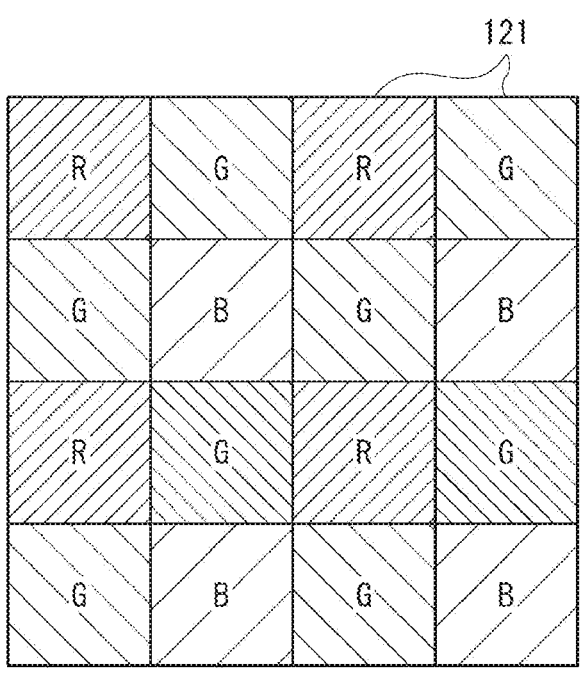
FIG. 11A is a schematic view of an example of a planar layout of a color filter in an imaging device according to Modification Example 3 of the present disclosure.
Figure 11B:
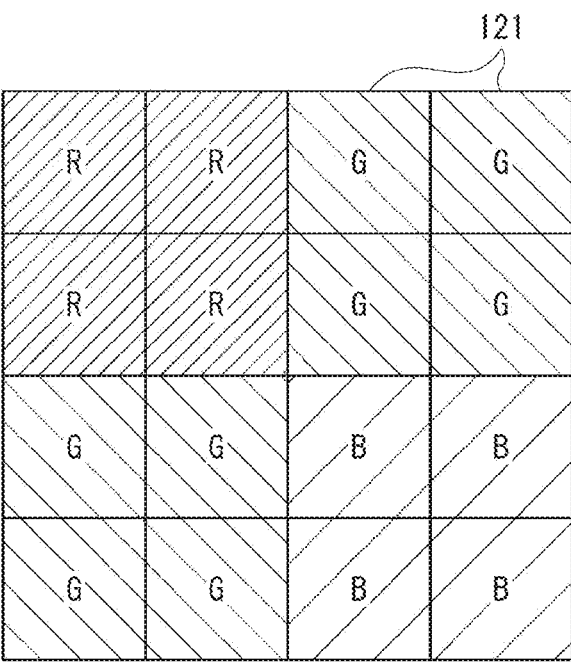
FIG. 11B is a schematic view of another example of the planar layout of the color filter in the imaging device according to Modification Example 3 of the present disclosure.

FIGS. 11A and 11B each schematically illustrate an example of a planar layout of the color filter CF in an imaging device according to Modification Example 3 of the present disclosure.

The color filter CF includes a red filter R, a green filter G, and a blue filter B corresponding to red (R), green (G), and blue (B) arranged for respective sensor pixels 121. The red filter R, the green filter G, and the blue filter B have a Bayer arrangement in the pixel array section 111, for example, as illustrated in FIG. 11A. Alternatively, the red filter R, the green filter G, and the blue filter B may each be arranged for every four sensor pixels 121 arranged in two rows and two columns, for example, as illustrated in FIG. 11B, and the four sensor pixels 121, as one unit, arranged in two rows and two columns may have a Bayer arrangement in the pixel array section 111.

Figure 12A:
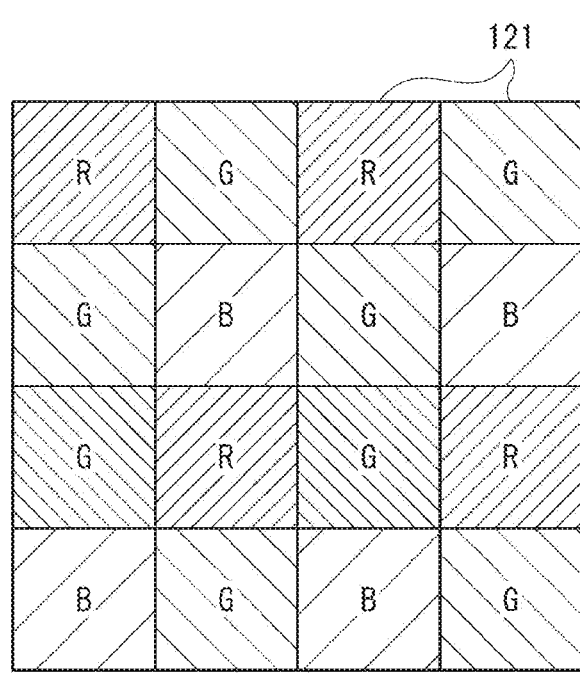
FIG. 12A is a schematic view of another example of the planar layout of the color filter in the imaging device according to Modification Example 3 of the present disclosure.
Figure 12B:
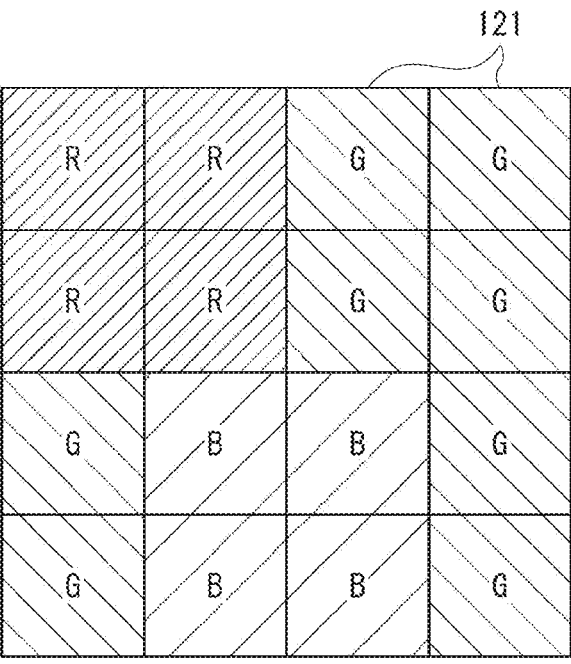
FIG. 12B is a schematic view of another example of the planar layout of the color filter in the imaging device according to Modification Example 3 of the present disclosure.

In addition, for example, in a case where the horizontal light-blocking portion 12H and the light-receiving lens LNS are shifted in the row direction by one sensor pixel 121 for each row as in the imaging device 1 in the foregoing first embodiment, the red filter R, the green filter G, and the blue filter B having a Bayer arrangement may be arranged to be shifted by one sensor pixel 121 depending on the positions of the horizontal light-blocking portion 12H and the light-receiving lens LNS as illustrated in FIGS. 12A and 12B.

It is to be noted that FIGS. 11A, 11B, 12A, and 12B each exemplify the color filters CF corresponding to red (R), green (G), and blue (B), but this is not limitative. A color filter DF may be configured by respective color filters corresponding to cyan (C), magenta (M), and yellow (Y), for example.

3-4. Modification Example 4

Figure 13:
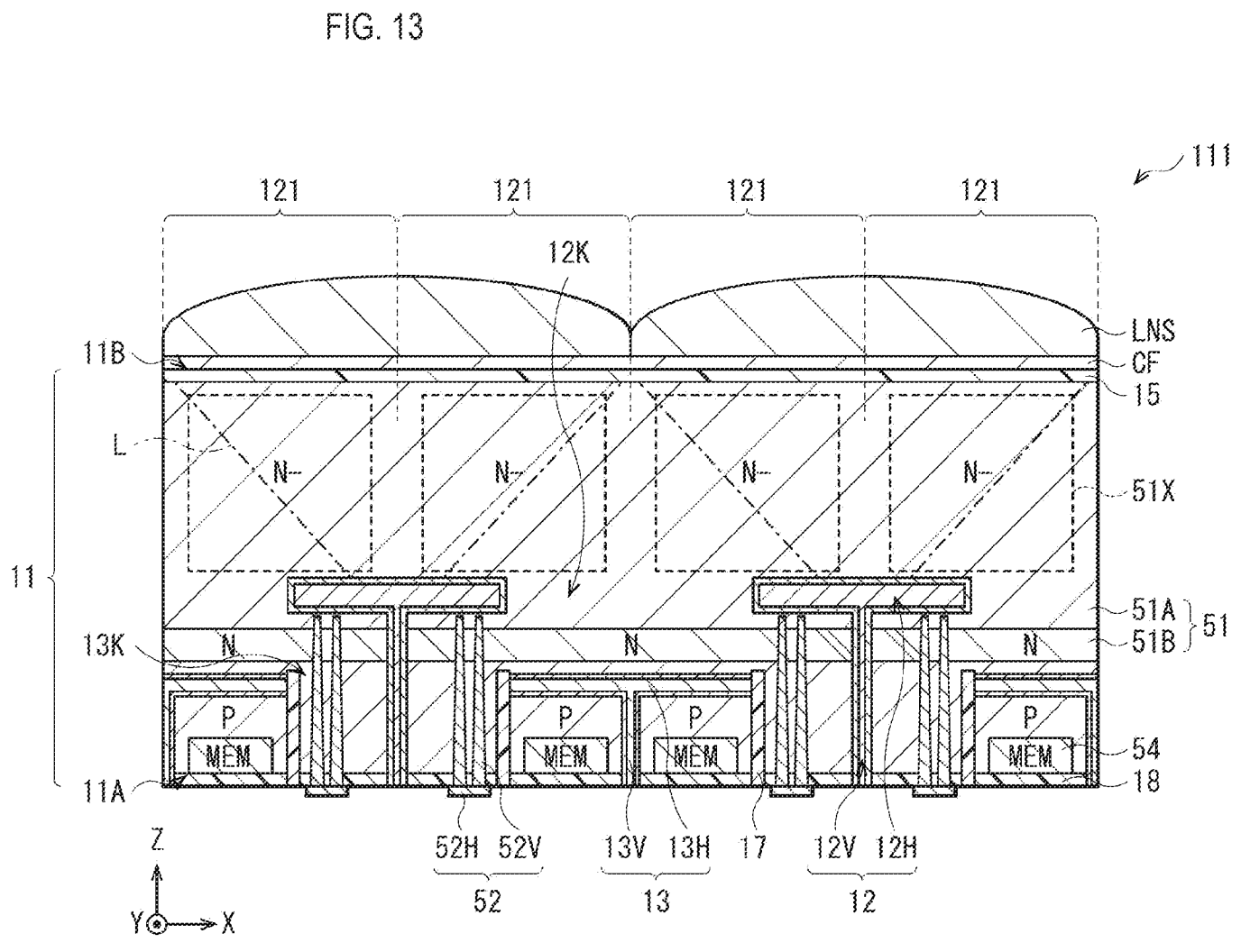

FIG. 13 illustrates an example of a cross-sectional configuration of the pixel array section 111 in an imaging device (e.g., imaging device 1) according to Modification Example 4 of the present disclosure. In the foregoing first embodiment, the vertical light-blocking portion 12V of the light-blocking section 12 is formed from the side of the back surface 11B of the semiconductor substrate 11; however, the vertical light-blocking portion 12V may be formed from the side of the front surface 11A of the semiconductor substrate 11.

As described above, the respective vertical light-blocking portions 12V and 13V of the light-blocking sections 12 and 13 may be formed from either the side of the front surface 11A of the semiconductor substrate 11 or the side of the back surface 11B of the semiconductor substrate 11.

3-5. Modification Example 5

Figure 14:
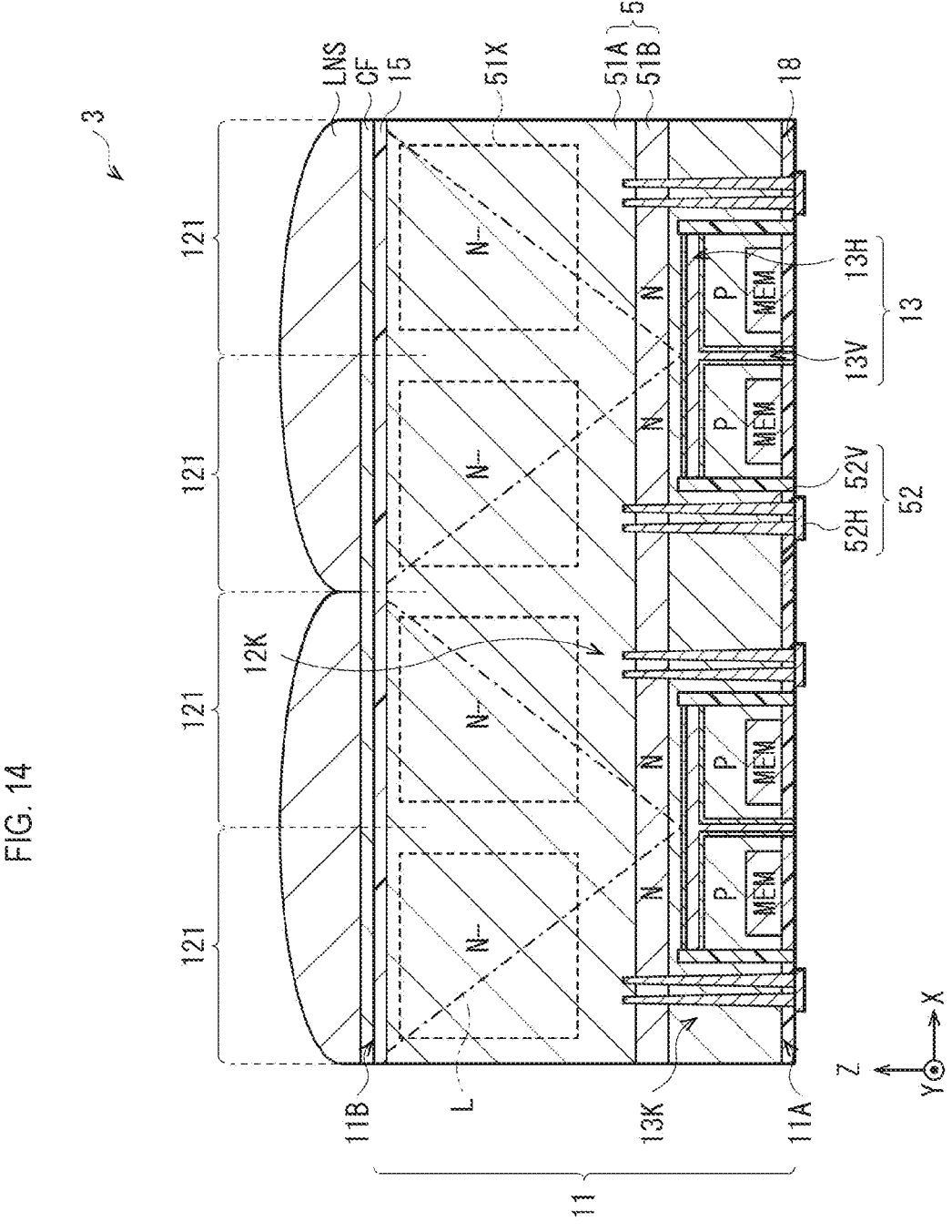
FIG. 14 is a schematic cross-sectional view of an example of a configuration of a pixel array section in an imaging device according to Modification Example 5 of the present disclosure.

FIG. 14 illustrates an example of a cross-sectional configuration of the pixel array section 111 in an imaging device (an imaging device 3) according to Modification Example 5 of the present disclosure.

In the foregoing first embodiment, the light-blocking section 12 (horizontal light-blocking portion 12H) positioned between the photoelectric conversion section 51 (photoelectric conversion region 51X) and the MEM 54 in the Z-axis direction, and the light-blocking section 13 (horizontal light-blocking portion 13H) that is positioned closer to the MEM 54 than the light-blocking section 12 and covers the side of the light-receiving surface of the MEM 54 are provided, to allow the light L transmitted through the light-receiving lens LNS to be condensed on the substantial geometric center of the horizontal light-blocking portion 12H; however, this is not limitative. For example, as illustrated in FIG. 14, the light L transmitted through the light-receiving lens LNS onto the substantial geometric center of the horizontal light-blocking portion 13H of the light-blocking section 13 without providing the light-blocking section 12 may be condensed on the substantial geometric center of the horizontal light-blocking portion 12H. In this case, the horizontal light-blocking portion 13H corresponds to a specific example of the "first light-blocking section" of the present disclosure, and the vertical light-blocking portion 13V corresponds to a specific example of the "third light-blocking section" of the present disclosure.

3-6. Modification Example 6

Figure 15:
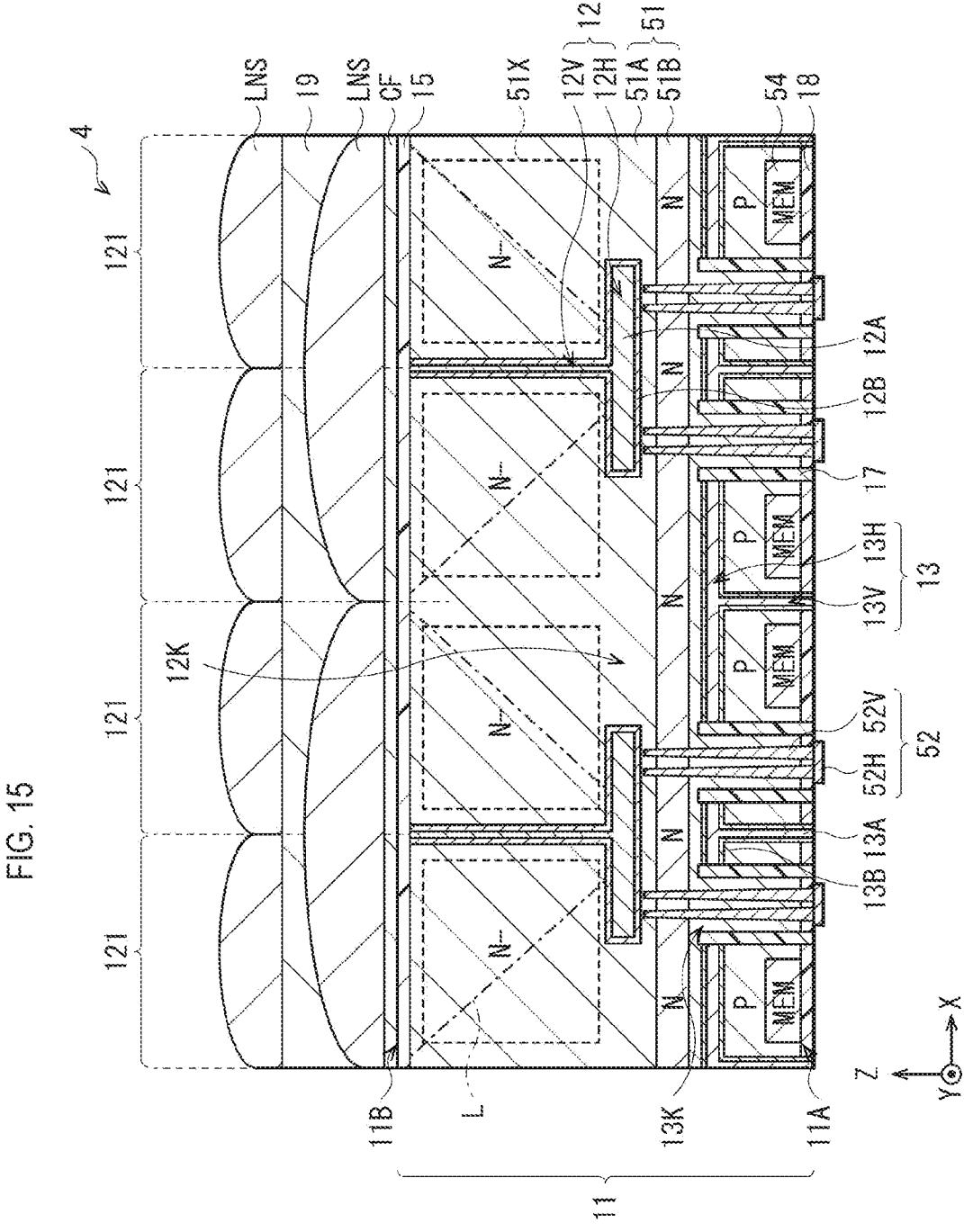
FIG. 15 is a schematic cross-sectional view of an example of a configuration of a pixel array section in an imaging device according to Modification Example 6 of the present disclosure.

FIG. 15 illustrates an example of a cross-sectional configuration of the pixel array section 111 in an imaging device (an imaging device 4) according to Modification Example 6 of the present disclosure.

The foregoing first embodiment gives the example in which one layer of the light-receiving lens LNS is provided on the side of the light-receiving surface of the semiconductor substrate 11; however, this is not limitative. For example, in a case where some of the sensor pixels 121 arranged in array in the pixel array section 111 are the image-plane phase difference pixels as described above, for example, a light-receiving lens LNS for pupil correction may be further provided above the light-receiving lens LNS with a protective film 19 interposed therebetween.

4. Example of Application to Electronic Apparatus

FIG. 16 is a block diagram illustrating a configuration example of a camera 2000 as an electronic apparatus to which the present technology is applied.

The camera 2000 includes an optical unit 2001 including a lens group or the like, an imaging device (imaging device) 2002 to which the above-described imaging device 1 or the like is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power supply unit 2008. The DSP circuit 2003, the frame memory 2004, the display unit 2005, the recording unit 2006, the operation unit 2007, and the power supply unit 2008 are coupled to one another via a bus line 2009.

The optical unit 2001 takes in incident light (image light) from a subject to form an image on an imaging surface of the imaging device 2002. The imaging device 2002 converts a light amount of the incident light formed, as an image, on the imaging surface by the optical unit 2001 into an electric signal on a pixel unit basis, and outputs the converted electric signal as a pixel signal.

The display unit 2005 includes, for example, a panel-type display device such as a liquid crystal panel or an organic EL panel, and displays a moving image or a still image captured by the imaging device 2002. The recording unit 2006 records the moving image or the still image captured by the imaging device 2002 in a recording medium such as a hard disk or a semiconductor memory.

The operation unit 2007 issues an operation command for various functions of the camera 2000 under the operation of a user. The power supply unit 2008 appropriately supplies various types of power for operation to the DSP circuit 2003, the frame memory 2004, the display unit 2005, the recording unit 2006, and the operation unit 2007 which are supply targets.

As described above, obtainment of a favorable image is expectable by using the above-described imaging device 1 or the like as the imaging device 2002.

5. Example of Practical Application to Mobile Body

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

Figure 17:
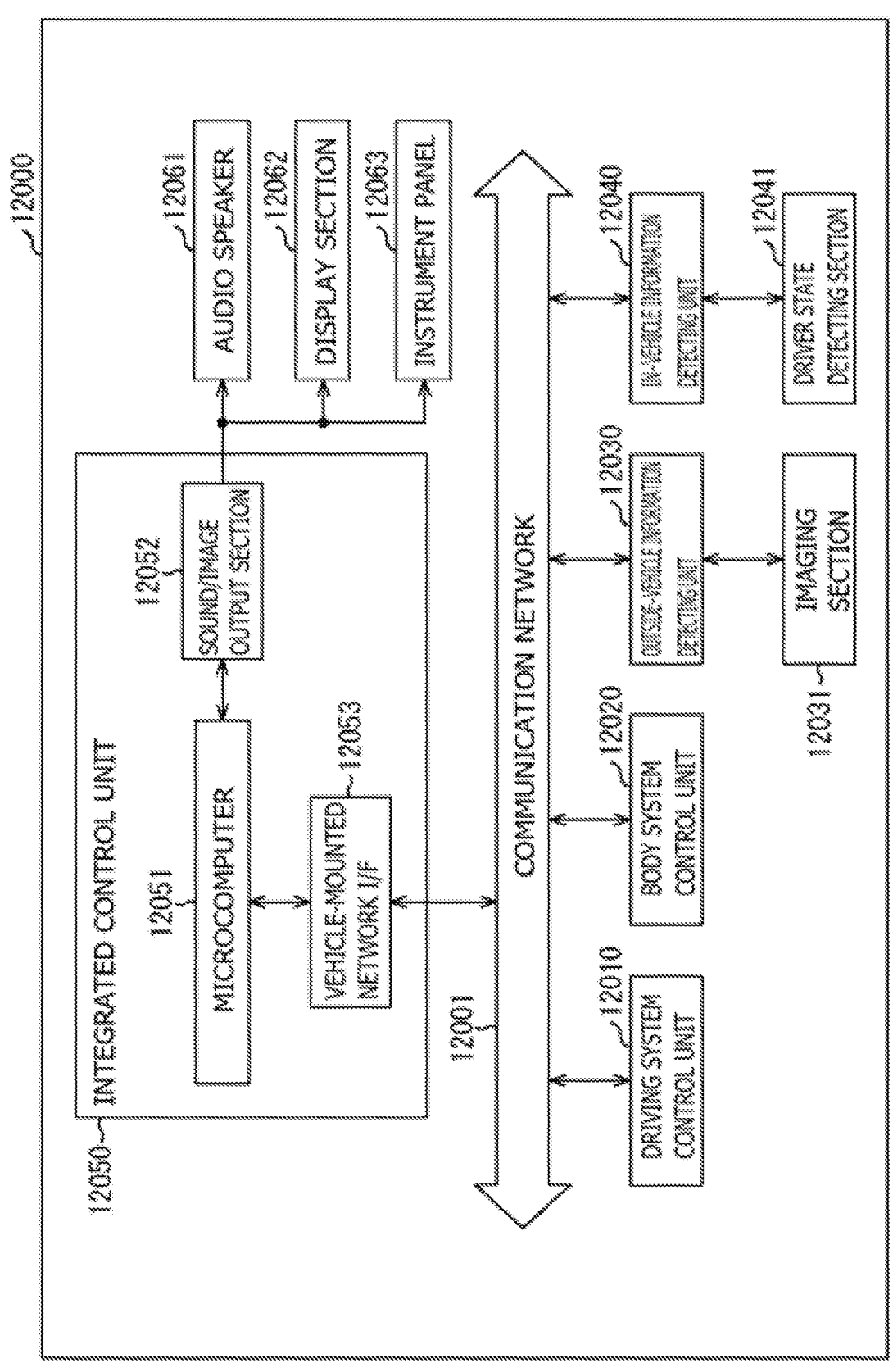
FIG. 17 is a block diagram depicting an example of schematic configuration of a vehicle control system.

FIG. 17 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

Figure 18:
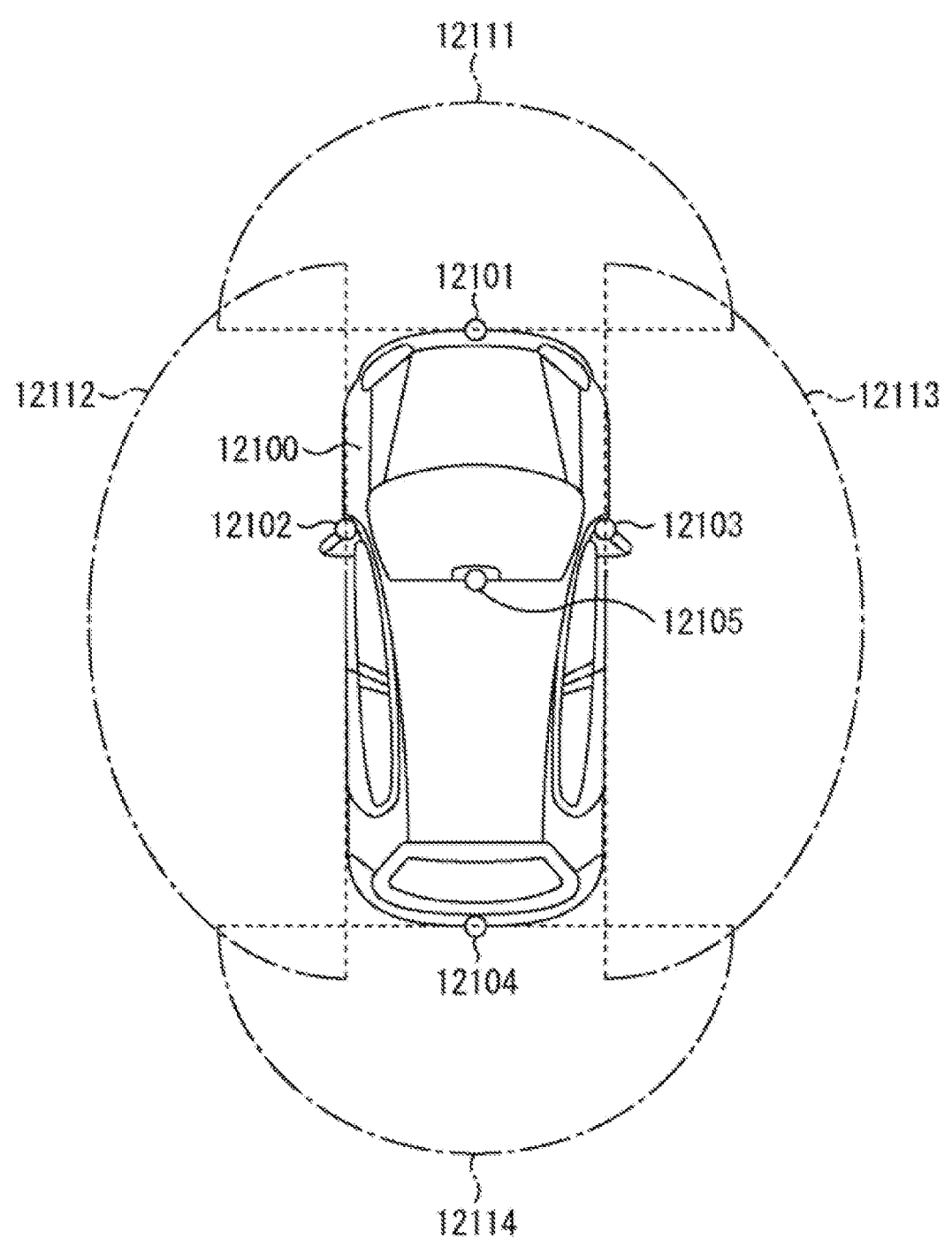
FIG. 18 is a diagram of assistance in explaining an example of installation positions of an outside-vehicle information detecting section and an imaging section.

FIG. 18 is a diagram depicting an example of the installation position of the imaging section 12031.

In FIG. 18, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 18 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to an embodiment of the present disclosure may be applied. The technology according to an embodiment of the present disclosure may be applied to the imaging section 12031 among components of the configuration described above. Specifically, the imaging device 1, or the like illustrated in FIG. 1 and other drawings is applicable to the imaging section 12031. A superior operation of the vehicle control system is expectable by application of the technology according to an embodiment of the present disclosure to the imaging section 12031.

13. Other Modification Examples

Although the description has been given hereinabove of the present disclosure with reference to the first and second embodiments and Modification Examples 1 to 6, the present disclosure is not limited to the foregoing embodiments and the like, and may be modified in a wide variety of ways. For example, the present disclosure is not limited to the back-illuminated image sensor, but is also applicable to a front-illuminated image sensor.

In addition, the foregoing embodiment and the like give the example in which one layer of the horizontal light-blocking portion 12H is provided in a plane of the semiconductor substrate 11, but this is not limitative; the horizontal light-blocking portion 12H may be configured by multiple layers. Further, the foregoing embodiments and the like exemplify, for example, the use of a spherical lens as the light-receiving lens LNS. However, it is sufficient for the shape of the light-receiving lens LNS to enable the light L transmitted through the photoelectric conversion region 51X without being absorbed by the photoelectric conversion region 51X to be condensed on the substantial geometric center of the horizontal light-blocking portion 12H. For example, a cylindrical lens or the like can also be used as the light-receiving lens LNS.

In addition, the imaging device of the present disclosure is not limited to an imaging device that detects a light amount distribution of visible light to acquire it as an image, but may be an imaging device that acquires, as an image, a distribution of an incidence amount of an infrared ray, an X-ray, a particle, or the like. In such a case, the color filter CF is omitted.

Furthermore, the imaging device of the present disclosure may be in the form of a module in which an imaging section and a signal processing section or an optical system are packaged together.

In addition, in the foregoing embodiment and the like, the description has been given of the memory holding global shutter back-illuminated image sensor; however, the present disclosure is not limited thereto. For example, an FD holding global shutter back-illuminated image sensor may be employed that holds electric charge in a charge voltage conversion section instead of the charge-holding section.

Figure 19A:
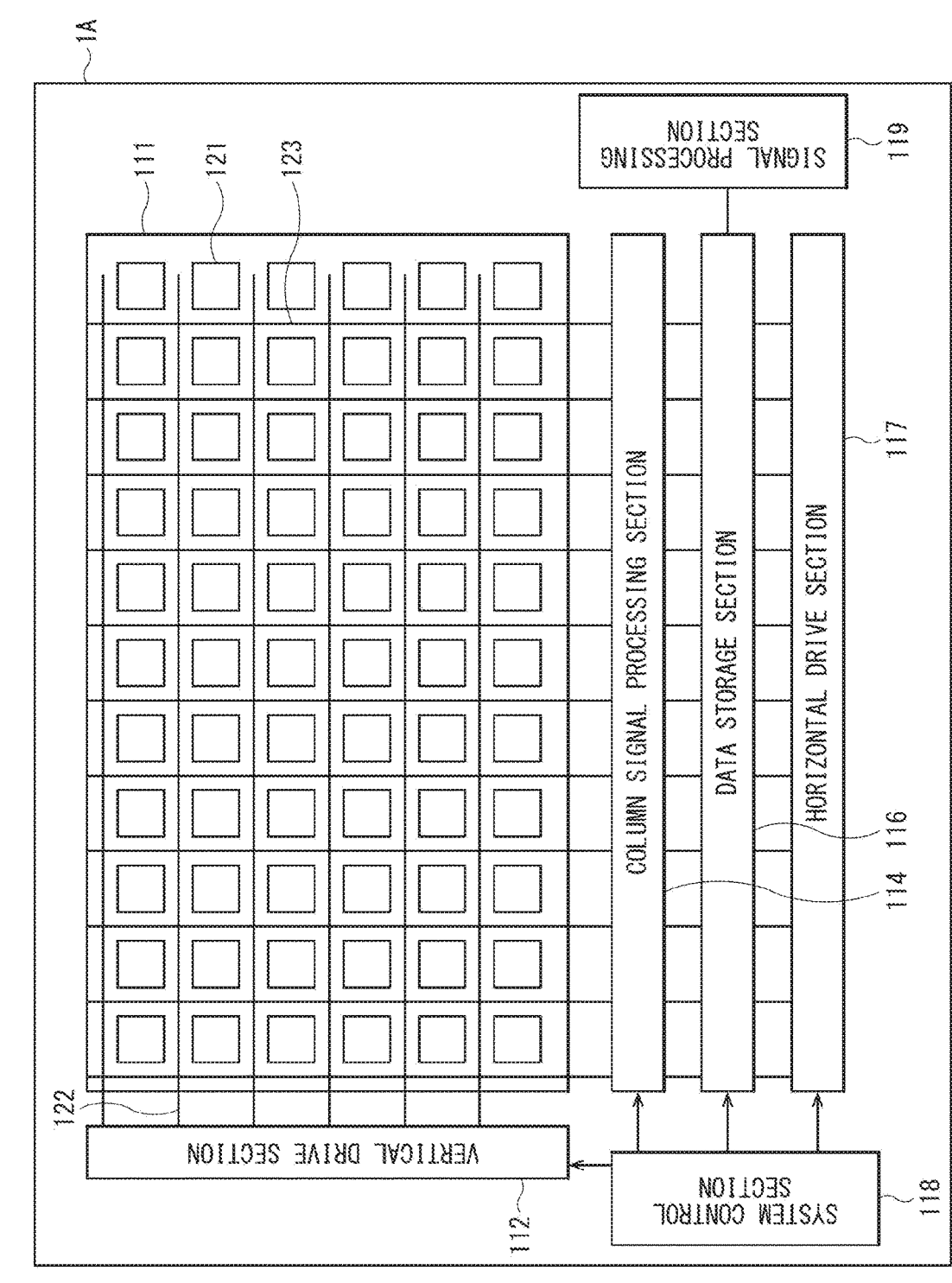
FIG. 19A is a block diagram illustrating a configuration example of an imaging device as another modification example of the present disclosure.
Figure 19B:
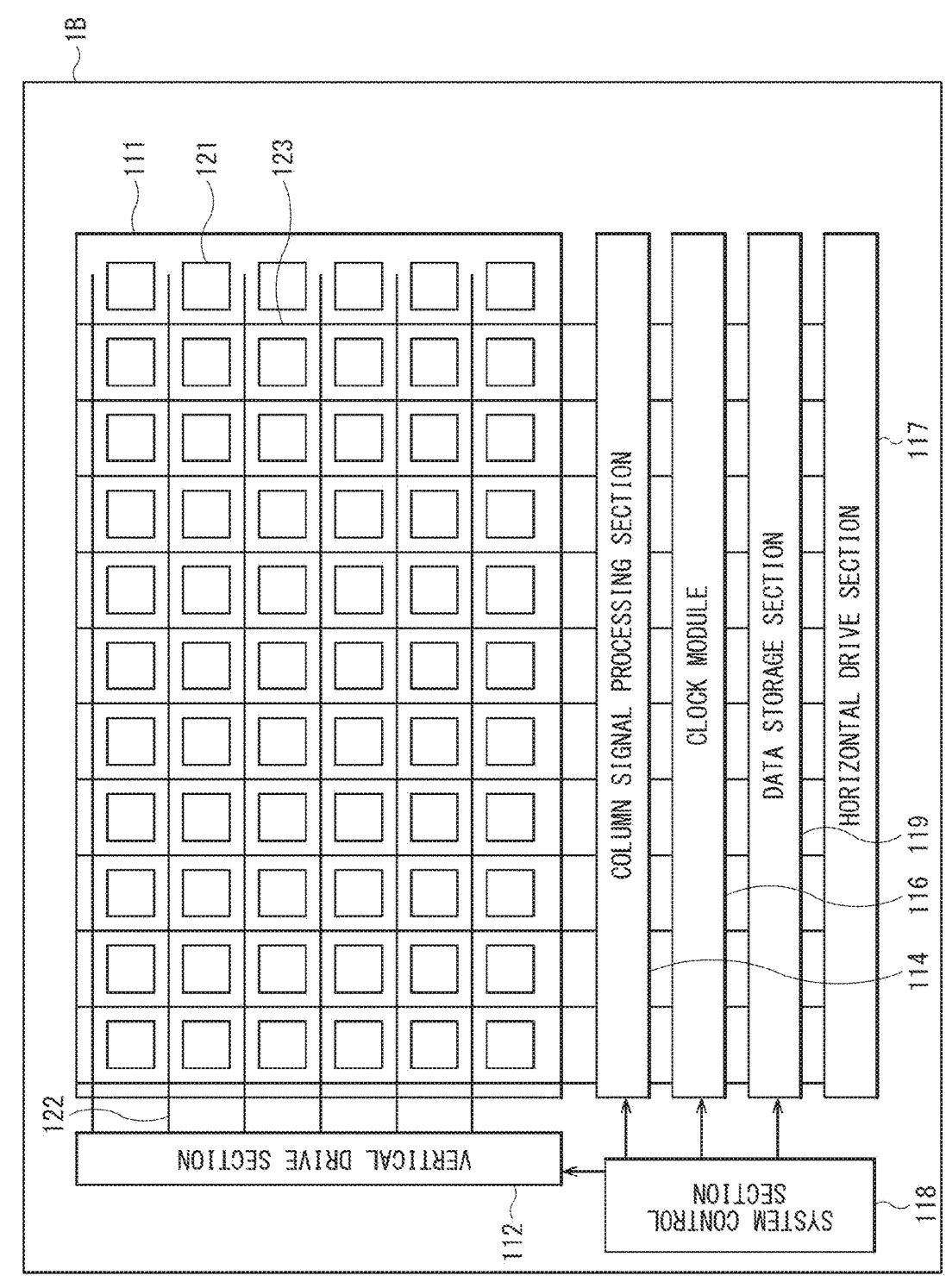
FIG. 19B is a block diagram illustrating a configuration example of an imaging device as another modification example of the present disclosure.

Further, a solid-state imaging device of the technology of the present disclosure may have the configurations as in an imaging device 1A illustrated in FIG. 19A or an imaging device 1B illustrated in FIG. 19B. FIG. 19A is a block diagram illustrating a configuration example of the imaging device 1A as a first modification example of the present disclosure. FIG. 19B is a block diagram illustrating a configuration example of the imaging device 1B as a second modification example of the present disclosure.

In the imaging device 1A in FIG. 19A, the data storage section 116 is disposed between the column signal processing section 114 and the horizontal drive section 117, and a pixel signal outputted from the column signal processing section 114 is supplied to the signal processing section 119 through the data storage section 116.

In addition, in the imaging device 1B in FIG. 19B, the data storage section 116 and the signal processing section 119 are arranged in parallel between the column signal processing section 114 and the horizontal drive section 117. In the imaging device 1B, the column signal processing section 114 performs A/D conversion to convert an analog pixel signal into a digital pixel signal for each column of the pixel array section 111 or for every multiple columns of the pixel array section 111.

It is to be noted that the effects described herein are merely exemplary and are not limited thereto, and may further include other effects.

In addition, the present disclosure may also have the following configurations. In the present technology of the following configurations, a first light-blocking section extending in an in-plane direction of a semiconductor substrate is provided between a photoelectric conversion section and a charge-holding section that are provided, respectively, on a side of a first surface and a side of a second surface, which are opposed to each other in the semiconductor substrate, and further a light-condensing optical system that condenses incident light on a geometric center of the first light-blocking section in a plan view is provided on the side of the first surface. Consequently, it is possible to prevent light having passed through without being absorbed by the photoelectric conversion section from entering the charge-holding section. Thus, it is possible to improve the PLS.

(1)

An imaging device including:

a semiconductor substrate in which multiple sensor pixels are arranged in array, the semiconductor substrate having a first surface that serves as a light incident surface and a second surface opposed to the first surface;

a photoelectric conversion section provided on a side of the first surface inside the semiconductor substrate and generating electric charge corresponding to an amount of light reception by photoelectric conversion;

a charge-holding section provided on a side of the second surface inside the semiconductor substrate and holding the electric charge transferred from the photoelectric conversion section;

a first light-blocking section extending in an in-plane direction of the semiconductor substrate between the photoelectric conversion section and the charge-holding section; and a light-condensing optical system provided on the side of the first surface and condensing incident light on a substantial geometric center of the first light-blocking section in a plan view.

(2)

The imaging device according to (1), in which the first light-blocking section is shared by the multiple sensor pixels.

(3)

The imaging device according to (1) or (2), in which the first light-blocking section is shared by four of the sensor pixels arranged in two rows and two columns.

(4)

The imaging device according to any one of (1) to (3), in which the first light-blocking section is provided continuously across multiple sensor pixels arranged side by side in one direction.

(5)

The imaging device according to any one of (1) to (4), in which the first light-blocking section is provided independently for each of the sensor pixels.

(6)

The imaging device according to any one of (1) to (5), in which, in the light-condensing optical system, multiple optical systems are arranged in array.

(7)

The imaging device according to any one of (1) to (6), in which each of the multiple optical systems is shared by the multiple sensor pixels.

(8)

The imaging device according to any one of (1) to (6), in which each of the multiple optical systems is arranged one by one for every four of the sensor pixels arranged in two rows and two columns.

(9)

The imaging device according to any one of (1) to (8), in which each of the multiple optical systems is shared by two of the sensor pixels adjacent to each other in one direction.

(10)

The imaging device according to any one of (1) to (8), in which the multiple optical systems are arranged one by one for one of the sensor pixels.

(11)

The imaging device according to any one of (1) to (8), in which the multiple optical systems are arranged for one of the sensor pixels.

(12)

The imaging device according to any one of (1) to (11), in which the photoelectric conversion section and the charge-holding section are provided for each of the sensor pixels.

(13)

The imaging device according to any one of (1) to (12), in which one layer or multiple layers of the first light-blocking sections are formed between the first surface and the second surface.

(14)

The imaging device according to any one of (1) to (13), in which the first light-blocking section has a first opening.

(15)

The imaging device according to (14), further including a second light-blocking section provided at a position opposed to at least the first opening, in a plan view, on the side of the second surface as compared with the first light-blocking section, the second light-blocking section preventing the incident light from entering the charge-holding section.

(16)

The imaging device according to any one of (1) to (15), further including a third light-blocking section extending from the side of the first surface or the side of the second surface to the first light-blocking section.

(17)

The imaging device according to (15), further including a fourth light-blocking section extending from the side of the first surface or the side of the second surface to the second light-blocking section.

(18)

The imaging device according to any one of (1) to (17), in which the first light-blocking section and the second light-blocking section each include aluminum or tungsten.

(19)

An electronic apparatus including an imaging device the imaging device including a semiconductor substrate in which multiple sensor pixels are arranged in array, the semiconductor substrate having a first surface that serves as a light incident surface and a second surface opposed to the first surface, a photoelectric conversion section provided on a side of the first surface inside the semiconductor substrate and generating electric charge corresponding to an amount of light reception by photoelectric conversion, a charge-holding section provided on a side of the second surface inside the semiconductor substrate and holding the electric charge transferred from the photoelectric conversion section, a first light-blocking section extending in an in-plane direction of the semiconductor substrate between the photoelectric conversion section and the charge-holding section, and a light-condensing optical system provided on the side of the first surface and condensing incident light on a substantial geometric center of the first light-blocking section in a plan view.

This application claims the benefit of Japanese Priority Patent Application JP2021-031152 filed with the Japan Patent Office on Feb. 26, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging device, comprising:

a semiconductor substrate in which multiple sensor pixels are arranged in an array, the semiconductor substrate having a first surface that serves as a light incident surface and a second surface opposed to the first surface;

a photoelectric conversion section provided on a side of the first surface inside the semiconductor substrate and generating electric charge corresponding to an amount of light reception by photoelectric conversion;

a charge-holding section provided on a side of the second surface inside the semiconductor substrate and holding the electric charge transferred from the photoelectric conversion section;

a first light-blocking section extending in an in-plane direction of the semiconductor substrate between the photoelectric conversion section and the charge-holding section, wherein the first light-blocking section has a first opening;

a second light-blocking section provided at a position opposed to at least the first opening, in a plan view, on the side of the second surface as compared with the first light-blocking section, the second light-blocking section preventing the incident light from entering the charge-holding section; and a light-condensing optical system provided on the side of the first surface and condensing incident light substantially onto a geometric center region of the first light-blocking section in a plan view.

2. The imaging device according to claim 1, wherein the first light-blocking section is shared by the multiple sensor pixels.

3. The imaging device according to claim 1, wherein the first light-blocking section is shared by four sensor pixels of the multiple sensor pixels arranged in two rows and two columns.

4. The imaging device according to claim 1, wherein the first light-blocking section is provided continuously across the multiple sensor pixels arranged side by side in one direction.

5. The imaging device according to claim 1, wherein the first light-blocking section is provided independently for each sensor pixel of the multiple sensor pixels.

6. The imaging device according to claim 1, wherein the light-condensing optical system comprises multiple optical systems arranged in an array.

7. The imaging device according to claim 6, wherein each optical system of the multiple optical systems is shared by the multiple sensor pixels.

8. The imaging device according to claim 6, wherein each optical system of the multiple optical systems is arranged one by one for every four sensor pixels of the multiple sensor pixels arranged in two rows and two columns.

9. The imaging device according to claim 6, wherein each optical system of the multiple optical systems is shared by two of the multiple sensor pixels adjacent to each other in one direction.

10. The imaging device according to claim 6, wherein the multiple optical systems are arranged one by one for one sensor pixel of the multiple sensor pixels.

11. The imaging device according to claim 6, wherein the multiple optical systems are arranged for one sensor pixel of the multiple sensor pixels.

12. The imaging device according to claim 1, wherein the photoelectric conversion section and the charge-holding section are provided for each sensor pixel of the multiple sensor pixels.

13. The imaging device according to claim 1, wherein one layer or multiple layers of the first light-blocking sections are formed between the first surface and the second surface.

14. The imaging device according to claim 1, further comprising a third light-blocking section extending from the side of the first surface or the side of the second surface to the first light-blocking section.

15. The imaging device according to claim 1, further comprising a fourth light-blocking section extending from the side of the first surface or the side of the second surface to the second light-blocking section.

16. The imaging device according to claim 1, wherein the first light-blocking section and the second light-blocking section each include aluminum or tungsten.

17. An electronic apparatus, comprising:
an optical system;

an imaging device that receives light from the optical system, the imaging device, comprising:
a semiconductor substrate in which multiple sensor pixels are arranged in an array, the semiconductor substrate having a first surface that serves as a light incident surface and a second surface opposed to the first surface;
a photoelectric conversion section provided on a side of the first surface inside the semiconductor substrate and generating electric charge corresponding to an amount of light reception by photoelectric conversion;
a charge-holding section provided on a side of the second surface inside the semiconductor substrate and holding the electric charge transferred from the photoelectric conversion section;
a first light-blocking section extending in an in-plane direction of the semiconductor substrate between the photoelectric conversion section and the charge-holding section,
wherein the first light-blocking section has a first opening;
a second light-blocking section provided at a position opposed to at least the first opening, in a plan view, on the side of the second surface as compared with the first light-blocking section, the second light-blocking section preventing the incident light from entering the charge-holding section; and
a light-condensing optical system provided on the side of the first surface and condensing incident light on substantially onto a geometric center region of the first light-blocking section in a plan view; and
a digital signal processor that processes signals received from the imaging device.

18. The electronic apparatus according to claim 17, wherein the first light-blocking section is shared by the multiple sensor pixels.

19. The electronic apparatus according to claim 17, wherein the first light-blocking section is shared by four sensor pixels of the multiple sensor pixels arranged in two rows and two columns.

20. The electronic apparatus according to claim 17, wherein the first light-blocking section is provided continuously across the multiple sensor pixels arranged side by side in one direction.

\* \* \* \* \*